(12) United States Patent
Conley et al.

(10) Patent No.: US 12,001,144 B2
(45) Date of Patent: Jun. 4, 2024

(54) FORMING MULTIPLE AERIAL IMAGES IN A SINGLE LITHOGRAPHY EXPOSURE PASS

(71) Applicant: Cymer, LLC, San Diego, CA (US)

(72) Inventors: Willard Earl Conley, San Diego, CA (US); Joshua Jon Thornes, San Diego, CA (US); Gregory Allen Rechtsteiner, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 17/973,629

(22) Filed: Oct. 26, 2022

(65) Prior Publication Data

US 2023/0152707 A1 May 18, 2023

Related U.S. Application Data

(62) Division of application No. 16/755,993, filed as application No. PCT/US2018/052949 on Sep. 26, 2018, now Pat. No. 11,526,082.

(60) Provisional application No. 62/574,628, filed on Oct. 19, 2017.

(51) Int. Cl.
*G03F 7/00* (2006.01)

(52) U.S. Cl.
CPC ...... *G03F 7/70041* (2013.01); *G03F 7/70575* (2013.01)

(58) Field of Classification Search
CPC ............. G03F 7/70041; G03F 7/70416; G03F 7/70458; G03F 7/70575
See application file for complete search history.

(56) References Cited

U.S. PATENT DOCUMENTS

| 4,395,117 A | 7/1983 | Suzuki |
| 4,869,999 A | 9/1989 | Fukuda et al. |
| 4,937,619 A | 6/1990 | Fukuda et al. |
| (Continued) | | |

FOREIGN PATENT DOCUMENTS

| CN | 1519590 A | 8/2004 |
| CN | 102612669 A | 7/2012 |
| (Continued) | | |

OTHER PUBLICATIONS

Office Action and Search Report, China National Intellectual Property Administration, counterpart Chinese Patent Application No. 201880077675.2, dated Dec. 16, 2022, 20 pages total (including English translation of 11 pages).

(Continued)

*Primary Examiner* — Steven Whitesell Gordon
(74) *Attorney, Agent, or Firm* — DiBerardino McGovern IP Group LLC

(57) ABSTRACT

A set of the pulses of light in a light beam is passed through a mask toward a wafer during a single exposure pass; at least a first aerial image and a second aerial image on the wafer based on pulses of light in the set of pulses that pass through the mask is generated during a single exposure pass, the first aerial image is at a first plane on the wafer and the second aerial image is at a second plane on the wafer, the first plane and the second plane being spatially distinct from each other and separated from each other by a separation distance along the direction of propagation; and a three-dimensional semiconductor component is formed.

21 Claims, 10 Drawing Sheets

(56) References Cited

U.S. PATENT DOCUMENTS

| | | | |
|---|---|---|---|
| 5,081,635 A | 1/1992 | Wakabayashi et al. | |
| 5,194,893 A | 3/1993 | Nishi | |
| 5,218,193 A | 6/1993 | Miyatake | |
| 5,303,002 A | 4/1994 | Yan | |
| 5,476,736 A | 12/1995 | Tanabe | |
| 5,483,311 A | 1/1996 | Sakakibara et al. | |
| 5,610,734 A | 3/1997 | Aharoni et al. | |
| 5,742,376 A | 4/1998 | Makinouch | |
| 5,831,715 A | 11/1998 | Takahashi | |
| 6,192,064 B1 | 2/2001 | Algots et al. | |
| 6,322,220 B1 | 11/2001 | Sano et al. | |
| 6,403,291 B1 | 6/2002 | Kawashima et al. | |
| 6,580,502 B1 | 6/2003 | Kuwabara | |
| 6,671,294 B2 | 12/2003 | Kroyan et al. | |
| 6,829,040 B1 | 12/2004 | Kye et al. | |
| 6,853,653 B2 | 2/2005 | Spangler et al. | |
| 6,871,337 B2 | 3/2005 | Socha | |
| 7,088,758 B2 | 8/2006 | Sandstrom et al. | |
| 7,139,301 B2 | 11/2006 | Kroyan et al. | |
| 7,154,928 B2 | 12/2006 | Sandstrom et al. | |
| 7,256,870 B2 | 8/2007 | Finders | |
| 7,286,207 B2 | 10/2007 | Nolscher et al. | |
| 7,382,815 B2 | 6/2008 | Spangler et al. | |
| 7,612,868 B2 | 11/2009 | Tsuchiya | |
| 7,655,367 B2 | 2/2010 | Buurman et al. | |
| 7,864,301 B2 | 1/2011 | Socha | |
| 7,965,387 B2 | 6/2011 | Hagiwara | |
| 8,144,739 B2 | 3/2012 | Figueroa et al. | |
| 8,705,004 B2 | 4/2014 | Butler et al. | |
| 8,938,694 B2 | 1/2015 | Liu et al. | |
| 8,989,225 B2 | 3/2015 | Kakizaki et al. | |
| 9,207,119 B2 | 12/2015 | Rokitski et al. | |
| 9,235,136 B2 | 1/2016 | Epple | |
| 9,625,824 B2 | 4/2017 | Lu et al. | |
| 9,715,180 B2 | 7/2017 | Lalovic et al. | |
| 9,989,864 B2 | 6/2018 | Baselmans et al. | |
| 9,989,866 B2 | 6/2018 | Mason et al. | |
| 2001/0007498 A1 | 7/2001 | Arai et al. | |
| 2002/0048288 A1 | 4/2002 | Kroyan et al. | |
| 2002/0051247 A1 | 5/2002 | Jutte et al. | |
| 2002/0167975 A1 | 11/2002 | Spangler et al. | |
| 2003/0022112 A1 | 1/2003 | Arifin et al. | |
| 2003/0090643 A1 | 5/2003 | Sato | |
| 2003/0178583 A1 | 9/2003 | Kampherbeek et al. | |
| 2004/0136075 A1 | 7/2004 | Augustyn et al. | |
| 2005/0041701 A1 | 2/2005 | Spangler et al. | |
| 2005/0068997 A1 | 3/2005 | Spangler et al. | |
| 2005/0078292 A1 | 4/2005 | Bruebach | |
| 2005/0078294 A1 | 4/2005 | Nellissen | |
| 2005/0205810 A1 | 9/2005 | Akins et al. | |
| 2005/0286598 A1 | 12/2005 | Sandstrom et al. | |
| 2006/0109874 A1 | 5/2006 | Shiozaki et al. | |
| 2006/0139606 A1 | 6/2006 | De Kruif et al. | |
| 2006/0146310 A1 | 7/2006 | De Kruif et al. | |
| 2006/0160037 A1 | 7/2006 | Brodsky et al. | |
| 2006/0209410 A1 | 9/2006 | Smith et al. | |
| 2006/0215134 A1 | 9/2006 | Burrman et al. | |
| 2006/0244937 A1* | 11/2006 | Nolscher | G03F 7/70575 355/67 |
| 2006/0256314 A1 | 11/2006 | Nolscher et al. | |
| 2006/0261050 A1 | 11/2006 | Krishnan et al. | |
| 2006/0268248 A1 | 11/2006 | Noelscher | |
| 2007/0013889 A1 | 1/2007 | Jorritsma et al. | |
| 2007/0260419 A1 | 11/2007 | Hagiwara | |
| 2008/0018943 A1 | 1/2008 | Eyal et al. | |
| 2009/0002666 A1* | 1/2009 | Tsuchiya | G03B 27/54 355/67 |
| 2009/0021718 A1* | 1/2009 | Melville | G03B 27/54 355/70 |
| 2009/0135399 A1 | 5/2009 | Hirukawa et al. | |
| 2010/0157266 A1 | 6/2010 | Zimmerman et al. | |
| 2011/0205512 A1 | 8/2011 | Seong et al. | |
| 2011/0249691 A1 | 10/2011 | O'Brien et al. | |
| 2013/0130182 A1 | 5/2013 | Markle et al. | |
| 2014/0104614 A1 | 4/2014 | Rokitski et al. | |
| 2014/0195993 A1 | 7/2014 | Liu et al. | |
| 2014/0236516 A1 | 8/2014 | Pforr | |
| 2015/0355025 A1 | 12/2015 | Duffey et al. | |
| 2015/0379185 A1* | 12/2015 | Morisaki | G03F 1/36 716/53 |
| 2015/0380893 A1 | 12/2015 | Matsunaga et al. | |
| 2016/0187788 A1 | 6/2016 | Onose et al. | |
| 2016/0320708 A1 | 11/2016 | Lu et al. | |
| 2017/0160647 A1 | 6/2017 | Baselmans et al. | |
| 2017/0176328 A1 | 6/2017 | Jak et al. | |
| 2017/0176879 A1 | 6/2017 | Witte et al. | |
| 2018/0123312 A1 | 5/2018 | Furastao et al. | |
| 2018/0159297 A1 | 6/2018 | Ahlawat et al. | |
| 2018/0254600 A1 | 9/2018 | Kumazaki et al. | |

FOREIGN PATENT DOCUMENTS

| | | |
|---|---|---|
| CN | 105445834 A | 3/2016 |
| EP | 0484131 A2 | 5/1992 |
| JP | S6364037 A | 3/1988 |
| JP | S6477123 A | 3/1989 |
| JP | H0194618 A | 4/1989 |
| JP | H0389512 A | 4/1991 |
| JP | H07183215 A | 7/1995 |
| JP | H0831734 A | 2/1996 |
| JP | 2940553 B2 | 8/1999 |
| JP | H11265842 A | 9/1999 |
| JP | 3031316 B2 | 4/2000 |
| JP | 2001092147 A | 4/2001 |
| JP | 2003133216 A | 5/2003 |
| JP | 2003152256 A | 5/2003 |
| JP | 2003264134 A | 9/2003 |
| JP | 2004046003 A | 2/2004 |
| JP | 2005513769 A | 5/2005 |
| JP | 2005158819 A | 6/2005 |
| JP | 2006216949 A | 8/2006 |
| JP | 2007511074 A | 4/2007 |
| JP | 2008504684 A | 2/2008 |
| JP | 2009164296 A | 7/2009 |
| JP | 2010122305 A | 6/2010 |
| JP | 2011110591 A | 6/2011 |
| JP | 2013156448 A | 8/2013 |
| TW | 200512546 A | 4/2005 |
| TW | I242114 B | 10/2005 |
| TW | 200816271 A | 4/2008 |
| TW | 201519700 A | 5/2015 |
| TW | 201725355 A | 7/2017 |
| WO | 2002073670 A | 9/2002 |
| WO | 2002093700 A1 | 11/2002 |
| WO | 2017026000 A1 | 5/2018 |
| WO | 2017098625 A1 | 10/2018 |

OTHER PUBLICATIONS

Second Office Action and Search Report, China National Intellectual Property Administration, counterpart Chinese Patent Application No. 201880077675.2, dated Jul. 19, 2023, 10 pages total (including English translation of 4 pages).

"Lithographic Apparatus," Research Disclosure by Anonymous, database No. 584052, Nov. 19, 2012. 6 pages total.

Office Action and Search Report, Intellectual Property Office (IPO) of Taiwan, counterpart Taiwanese Patent Application No. 110128890, dated Jan. 27, 2022, 12 pages total (including English translation of 5 pages).

Decision of Rejection, Japan Patent Office, counterpart Japanese Patent Application No. 2020-521348, dated Mar. 10, 2022, 9 pages total (including English translation of 5 pages).

Rafaelli et al., "KrF Resists for Implant Layers Patterning Extreme High Aspect Ratio Structures with a Double Focal Plane Exposure Technique," Proc. of SPIE, vol. 8325, 83252D (2012).

Zavecz, "Bossung Curves; an old technique with a new twist for sub-90 nm nodes," Proc. of SPIE, vol. 6152-109 (2006).

Lalovic et al., "RELAX: Resolution Enhancement by Laser-spectrum Adjusted Exposure," Proc. SPIE, vol. 5754, pp. 447-455 (2005) (doi:10.1117/12.601002).

(56) References Cited

OTHER PUBLICATIONS

Office Action, of Japan Patent Office, counterpart Japanese Patent Application No. 2020-521348, dated May 17, 2021, 9 pages total (including English translation of 5 pages).
Office Action, Korean Intellectual Property Office, counterpart Korean Patent Application No. 10-2020-7012712, daated Sep. 17, 2021, 9 pages total (including English translation of 5 pages).
Blaine R. Copenheaver, U.S. International Searching Authority, International Search Report and Written Opinion, corresponding PCT Application No. PCT/2018/052949, dated Nov. 30, 2018, 7 pages total.

\* cited by examiner

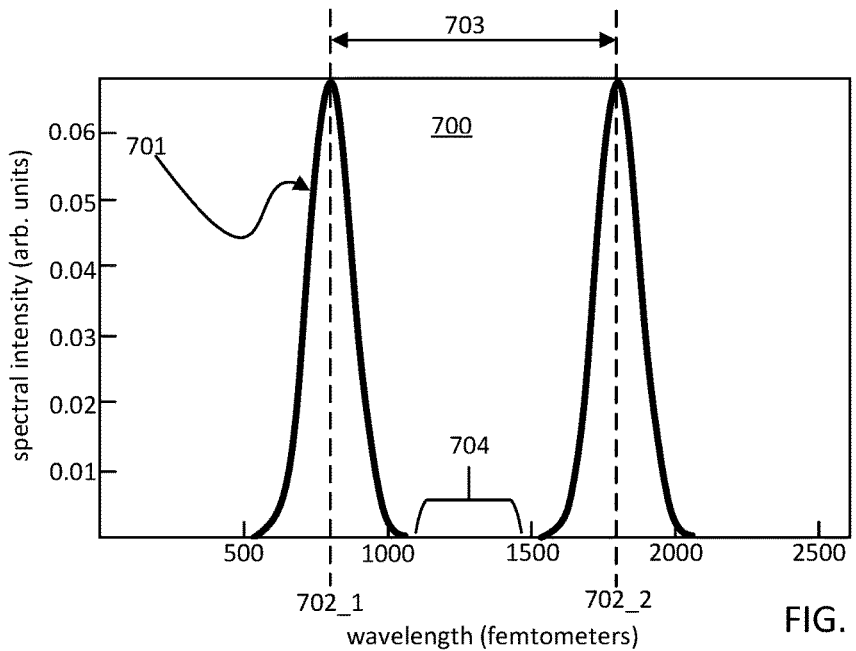
FIG. 7
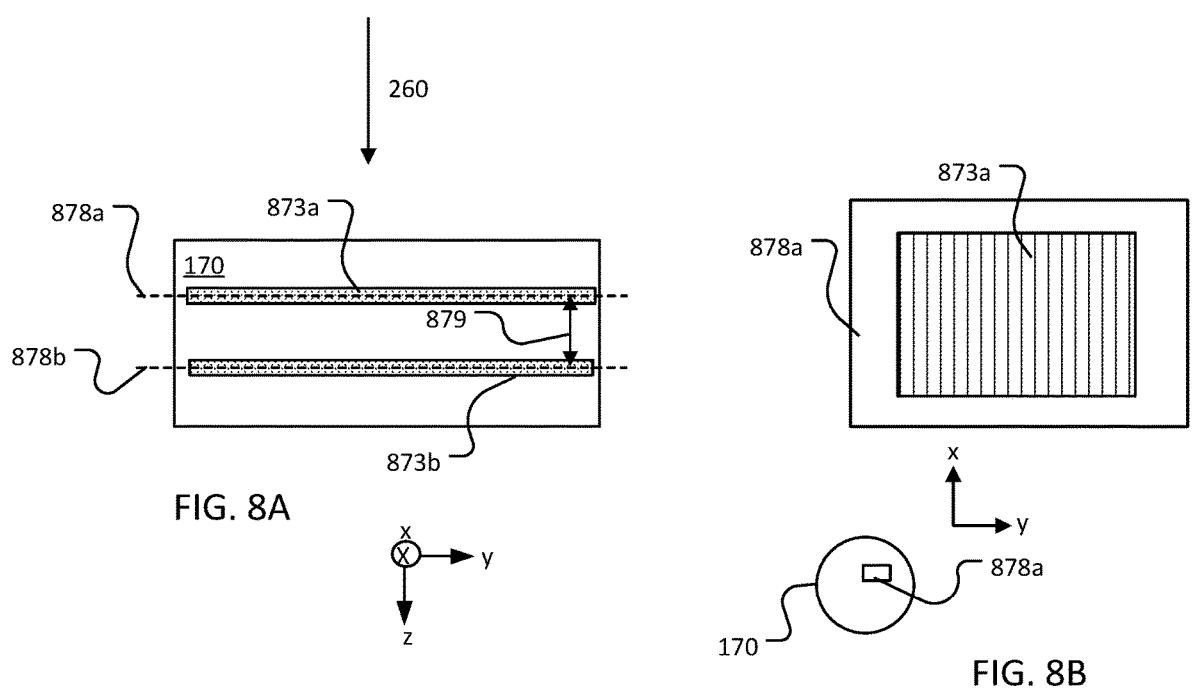
FIG. 8A
FIG. 8B ic images in
FORMING MULTIPLE AERIAL IMAGES IN A SINGLE LITHOGRAPHY EXPOSURE PASS

CROSS-REFERENCE TO RELATED APPLICATIONS

This application is a divisional of U.S. application Ser. No. 16/755,993, which is the national phase of International Application No. PCT/US2018/052949, filed Sep. 26, 2018 and titled FORMING MULTIPLE AERIAL IMAGES IN A SINGLE LITHOGRAPHY EXPOSURE PASS, which claims priority to U.S. Application No. 62/574,628, which was filed on Oct. 19, 2017. Each of these patent applications is incorporated herein in its entirety by reference.

TECHNICAL FIELD

This disclosure relates to forming multiple aerial images in a single lithography exposure pass. The techniques discussed below may be used, for example, to form a three-dimensional semiconductor component.

BACKGROUND

Photolithography is the process by which semiconductor circuitry is patterned on a substrate such as a silicon wafer. A photolithography optical source provides the deep ultraviolet (DUV) light used to expose a photoresist on the wafer. DUV light for photolithography is generated by excimer optical sources. Often, the optical source is a laser source and the pulsed light beam is a pulsed laser beam. The light beam is passed through a beam delivery unit, a reticle or a mask, and then projected onto a prepared silicon wafer. In this way, a chip design is patterned onto a photoresist that is then etched and cleaned, and then the process repeats.

SUMMARY

In one general aspect, a method of forming a three-dimensional semiconductor component using a photolithography system includes directing a pulsed light beam along a direction of propagation toward a mask, the pulsed light beam including a plurality of pulses of light; passing a set of the pulses of light in the light beam through the mask toward a wafer during a single exposure pass; generating, during the single exposure pass, at least a first aerial image and a second aerial image on the wafer based on pulses of light in the set of pulses that pass through the mask, the first aerial image being at a first plane on the wafer and the second aerial image being at a second plane on the wafer, the first plane and the second plane being spatially distinct from each other and separated from each other by a separation distance along the direction of propagation; and forming the three-dimensional semiconductor component based on an interaction between light in the first aerial image and a material in a first portion of the wafer and an interaction between light in the second aerial image and a material in a second portion of the wafer. At least one of the pulses in the set of pulses has a first primary wavelength and at least one of the other pulses in the set of pulses has a second primary wavelength that is different from the first primary wavelength, such that the separation distance is formed during the single exposure pass based on the difference between the first primary wavelength and the second primary wavelength.

Implementations may include one or more of the following features. At least one of the pulses in the set of pulses that passes through the mask during the single exposure pass may have more than one primary wavelength of light.

Each primary wavelength may be separated by a spectral separation of 200 femtometers (fm) to 500 picometers (pm) from the nearest other primary wavelength.

The separation distance between the first aerial image and the second aerial image may change during the single exposure pass.

The single exposure pass may be a first exposure pass, and the method also may include passing a second set of pulses of light in the light beam through the mask toward the wafer during a second exposure pass and after the first exposure pass is completed. The separation distance between the first aerial image and the second aerial image is different during the first exposure pass and the second exposure pass.

The separation distance between the first aerial image and the second aerial image may be set prior to the single exposure pass, and, in some implementations, the separation distance does not change during the single exposure pass. The separation distance between the first aerial image and the second aerial image may be set to accommodate one or more features of the photolithography system.

The set of pulses may include a first group of pulses of light and a second group of pulses of light, each pulse in the first group of pulses of light has the first primary wavelength, each pulse in the second group of pulses may have the second primary wavelength, and the method also may include: controlling a property of the first group of pulses to thereby control an amount of light in the first aerial image; and controlling a property of the second group of pulses to thereby control an amount of light in the second aerial image. The property of the first group may be a count of pulses in the first group, and the property of the second group may be a count of pulses in the second group. Controlling the count of pulses in the first group may include determining, before the single exposure pass begins, a first number of pulses to include in the first group of pulses, and controlling the second number of pulses may include determining, before the single exposure pass, a second number of pulses to include in the second group of pulses. The first group of pulses and the second group of pulses may include all of the pulses that pass through the mask in the single exposure pass. Determining the first number of pulses and the second number of pulses may include one or more of: (a) receiving input from an operator and (b) accessing a predefined setting associated with the photolithography system. The property of the first group of pulses may include an intensity of each pulse in the first group, and the property of the second group of pulses may include an intensity of each pulse in the second group.

The first plane on the wafer and the second plane on the wafer may be planes that are substantially perpendicular to the direction of propagation.

In some implementations, a first feature of the three-dimensional semiconductor is formed at the first plane, a second feature of the three-dimensional semiconductor is formed at the second plane, and the first and second features are displaced from each other by a sidewall that extends substantially parallel to the direction of propagation.

The three-dimensional semiconductor component may be a three-dimensional NAND flash memory component.

The first plane may correspond to a first focal plane and the second plane corresponds to a second focal plane, and the separation distance between the first plane and the second plane is based on a difference between one or more wavelengths in a pulse of light that passes through the mask or a difference between a wavelengths among discrete pulses in the set of pulses.

In another general aspect, a photolithography system includes a light source; a lithography scanner apparatus including: a mask positioned to interact with a pulsed light beam from the light source, and a wafer holder; and a control system coupled to the light source, the control system configured to cause the light source to emit the pulsed light beam toward the lithography scanner apparatus during a single exposure pass such that, during the single exposure pass, at least a first aerial image and a second aerial image are formed on a wafer received at the wafer holder based on pulses of light in a set of pulses of light that pass through the mask along a direction of propagation, the first aerial image being at a first plane on the wafer and the second aerial image being at a second plane on the wafer, the first plane and the second plane being spatially distinct from each other and separated from each other by a separation distance along the direction of propagation, and a three-dimensional semiconductor component is formed based on an interaction between light in the first aerial image and a material in a first portion of the wafer and an interaction between light in the second aerial image and a material in a second portion of the wafer. At least one of the pulses in the set of pulses has a first primary wavelength, at least one of the other pulses in the set of pulses has a second primary wavelength that is different from the first primary wavelength, and the separation distance between first aerial image and the second aerial image is based on the difference between the first primary wavelength and the second primary wavelength.

Implementations may include one or more of the following features. The control system may include a computer-readable storage medium, one or more electronic processors coupled to the computer-readable storage medium, and an input/output interface, and a recipe related to the photolithography system is stored on the computer-readable storage medium. The recipe may specify the separation distance. The recipe specifies the separation distance on a per-wafer or per-lot basis. The light source may include a krypton fluoride (KrF) gain medium or a argon fluoride (ArF) gain medium.

Implementations of any of the techniques described above and herein may include a process, an apparatus, a control system, instructions stored on a non-transient machine-readable computer medium, and/or a method. The details of one or more implementations are set forth in the accompanying drawings and the description below. Other features will be apparent from the description and drawings, and from the claims.

BRIEF DESCRIPTION OF THE DRAWINGS

FIGS. 3A-3C are plots of data that relate to the production of pulses and/or bursts of pulses in an optical source, in which FIG. 3C shows an amplitude of a trigger signal as a function of time.

FIG. 7 shows an example of an average optical spectrum for a single exposure pass.

FIGS. 8A and 8B show side and top cross-sectional views, respectively, of an example of a wafer.

DETAILED DESCRIPTION

Techniques for forming more than one aerial image, each at a different plane, in a single lithography pass, and forming a three-dimensional semiconductor component using the aerial images are discussed herein.

Figure 1A:
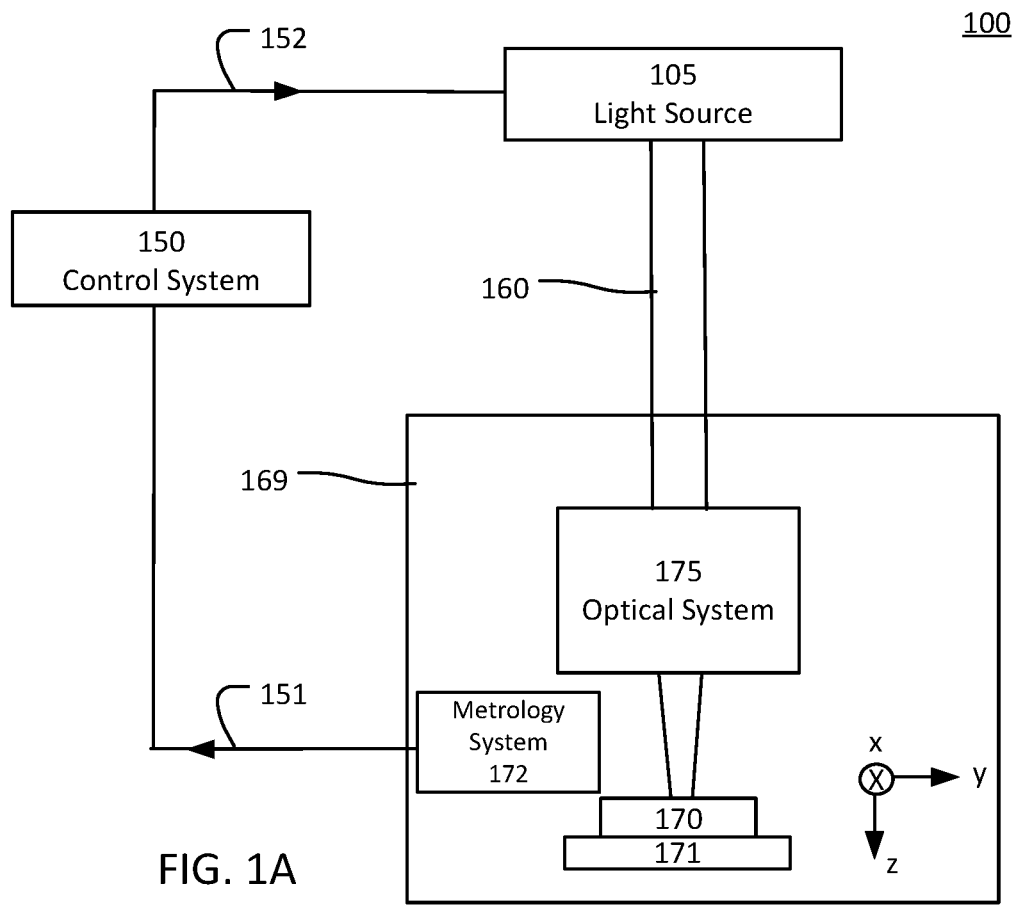
FIG. 1A is a block diagram of an example of an implementation of a photolithography system.

Referring to FIG. 1A, a photolithography system 100 includes an optical (or light) source 105 that provides a light beam 160 to a lithography exposure apparatus 169, which processes a wafer 170 received by a wafer holder or stage 171. The light beam 160 is a pulsed light beam that includes pulses of light separated from each other in time. The lithography exposure apparatus 169 includes a projection optical system 175 through which the light beam 160 passes prior to reaching the wafer 170, and a metrology system 172. The metrology system 172 may include, for example, a camera or other device that is able to capture an image of the wafer 170 and/or the light beam 160 at the wafer 170, or an optical detector that is able to capture data that describes characteristics of the light beam 160, such as intensity of the light beam 160 at the wafer 170 in the x-y plane. The lithography exposure apparatus 169 can be a liquid immersion system or a dry system. The photolithography system 100 also may include a control system 150 to control the light source 105 and/or the lithography exposure apparatus 169.

Figure 1B:
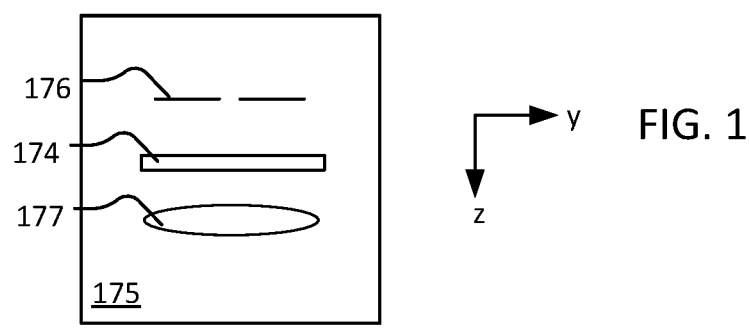
FIG. 1B is a block diagram of an example of an implementation of an optical system for the photolithography system of FIG. 1A.

Microelectronic features are formed on the wafer 170 by, for example, exposing a layer of radiation-sensitive photoresist material on the wafer 170 with the light beam 160. Referring also to FIG. 1B, the projection optical system 175 includes a slit 176, a mask 174, and a projection objective, which includes a lens 177. The light beam 160 enters the optical system 175 and impinges on the slit 176, and at least some of the beam 160 passes through the slit 176. In the example of FIGS. 1A and 1B, the slit 176 is rectangular and shapes the light beam 160 into an elongated rectangular shaped light beam. A pattern is formed on the mask 174, and the pattern determines which portions of the shaped light beam are transmitted by the mask 174 and which are blocked by the mask 174. The design of the pattern is determined by the specific microelectronic circuit design that is to be formed on the wafer 170.

The shaped light beam interacts with the mask 174. The portions of the shaped light beam that are transmitted by the mask 174 pass through (and may be focused by) the projection lens 177 and expose the wafer 170. The portions of the shaped light beam that are transmitted by the mask 174 form an aerial image in the x-y plane in the wafer 170. The aerial image is the intensity pattern formed by the light that reaches the wafer 170 after interacting with the mask 174. The aerial image is at the wafer 170 and extends generally in the x-y plane.

Figure 1C:
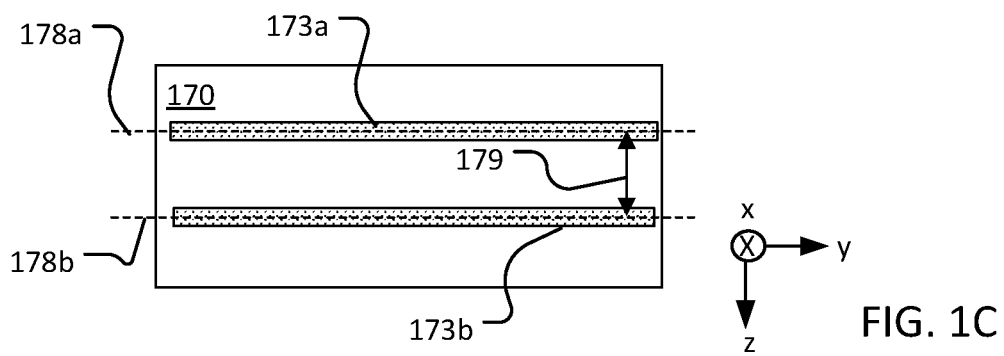
FIG. 1C is a cross-sectional view of an example of a wafer exposed by the photolithography system of FIG. 1A.

The system 100 is able to form a plurality of aerial images during a single exposure pass, with each of the aerial images being at a spatially distinct location along the z axis in the wafer 170. Referring also to FIG. 1C, which shows a cross-sectional view of the wafer 170 in the y-z plane, the projection optical system 175 forms two aerial images 173a, 173b at different planes along the z axis in a single exposure pass. As discussed in greater detail below, each of the aerial images 173a, 173b is formed from light having a different primary wavelength.

The location of the aerial image along the z axis depends on the characteristics of the optical system 175 (including the projection lens 177 and the mask 174) and the wavelength of the light beam 160. The focal position of the lens 177 depends on the wavelength of the light incident on the lens 177. Thus, varying or otherwise controlling the wavelength of the light beam 160 allows the position of the aerial image to be controlled. By providing pulses having different primary wavelengths of light during a single exposure pass, a plurality (two or more) of aerial images, which are each at a different location along the z axis, may be formed in a single exposure pass without moving the optical system 175 (or any components of the optical system 175) and the wafer 170 relative to each other along the z axis.

In the example of FIG. 1A, light passing through the mask 174 is focused to a focal plane by the projection lens 177. The focal plane of the projection lens 177 is between the projection lens 177 and the wafer stage 171, with the position of the focal plane along the z axis depending on the properties of the optical system 175 and the wavelength of the light beam 160. The aerial images 173a, 173b are formed from light having different wavelengths, thus the aerial images 173a, 173b are at different locations in the wafer 170. The aerial images 173a, 173b are separated from each other along the z axis by a separation distance 179. The separation distance 179 depends on the difference between the wavelength of the light that forms the aerial image 173a and the wavelength of the light that forms the aerial image 173b.

The wafer stage 171 and the mask 174 (or other parts of the optical system 175) generally move relative to each other in the x, y, and z directions during scanning for routine performance corrections and operation, for example, the motion may be used to accomplish basic leveling, compensation of lens distortions, and for compensation of stage positioning error. This relative motion is referred to as incidental operational motion. However, in the system of FIG. 1A, the relative motion of the wafer stage 171 and the optical system 175 is not relied upon to form the separation distance 179. Instead, the separation distance 179 is formed due to the ability to control the primary wavelengths in the pulses that pass through the mask 174 during the exposure pass. Thus, unlike some prior systems, the separation distance 179 is not created only by moving the optical system 175 and the wafer 170 relative to each other along the z direction. Moreover, the aerial images 173a and 173b are both present at the wafer 170 during the same exposure pass. In other words, the system 100 does not require that the aerial image 173a be formed in a first exposure pass and the aerial image 173b be formed in a second, subsequent exposure pass.

The light in the first aerial image 173a interacts with the wafer at a portion 178a, and the light in the second aerial image 173b interacts with the wafer at a portion 178b. These interactions may form electronic features or other physical characteristics, such as openings or holes, on the wafer 170. Because the aerial images 173a, 173b are at different planes along the z axis, the aerial images 173a, 173b may be used to form three-dimensional features on the wafer 170. For example, the aerial image 173a may be used to form a periphery region, and the aerial image 173b may be used to form a channel, trench, or recess that is at a different location along the z axis. As such, the techniques discussed herein may be used to form a three-dimensional semiconductor component, such as a three-dimensional NAND flash memory component.

Before discussing additional details related to forming multiple aerial images in a single exposure pass, example implementations of the light source 105 and the photolithography system 100 are discussed with respect to FIGS. 2A-2C, 3A-3C, and 4.

Figure 2A:
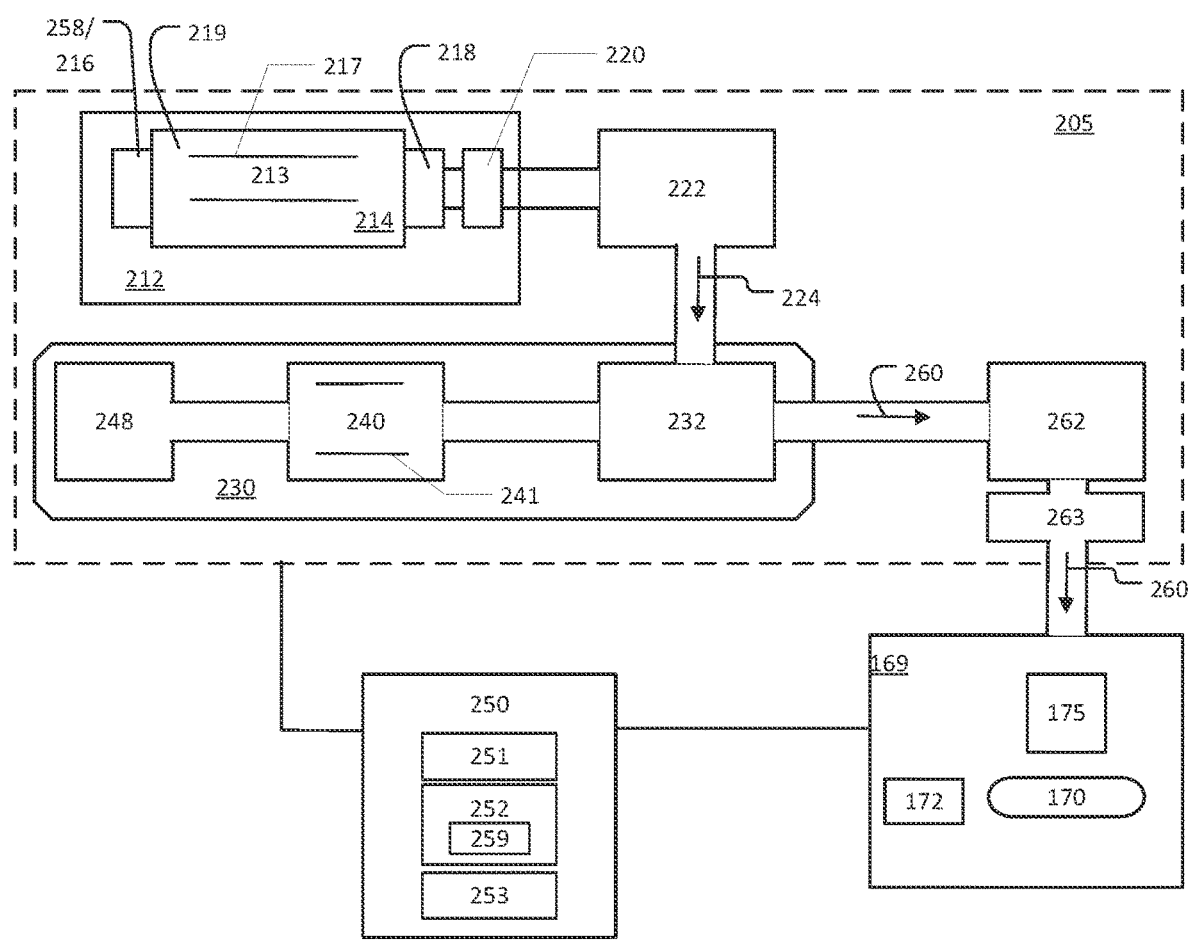
FIG. 2A is a block diagram of another example of an implementation of a photolithography system.

Referring to FIG. 2A, a block diagram of a photolithography system 200 is shown. The system 200 is an example of an implementation of the system 100 (FIG. 1A). For example, in the photolithography system 200, an optical source 205 is used as the optical source 105 (FIG. 1A). The optical source 205 produces a pulsed light beam 260, which is provided to the lithography exposure apparatus 169. The optical source 205 may be, for example, an excimer optical source that outputs the pulsed light beam 260 (which may be a laser beam). As the pulsed light beam 260 enters the lithography exposure apparatus 169, it is directed through the projection optical system 175 and projected onto the wafer 170. In this way, one or more microelectronic features are patterned onto a photoresist on the wafer 170 that is then developed and cleaned prior to subsequent process steps, and the process repeats. The photolithography system 200 also includes the control system 250, which, in the example of FIG. 2A, is connected to components of the optical source 205 as well as to the lithography exposure apparatus 169 to control various operations of the system 200. The control system 250 is an example of an implementation of the control system 250 of FIG. 1A.

In the example shown in FIG. 2A, the optical source 205 is a two-stage laser system that includes a master oscillator (MO) 212 that provides a seed light beam 224 to a power amplifier (PA) 230. The MO 212 and the PA 230 may be considered to be subsystems of the optical source 205 or systems that are part of the optical source 205. The power amplifier 230 receives the seed light beam 224 from the master oscillator 212 and amplifies the seed light beam 224 to generate the light beam 260 for use in the lithography exposure apparatus 169. For example, the master oscillator 212 may emit a pulsed seed light beam, with seed pulse energies of approximately 1 milliJoule (mJ) per pulse, and these seed pulses may be amplified by the power amplifier 230 to about 10 to 15 mJ.

Figure 2B:
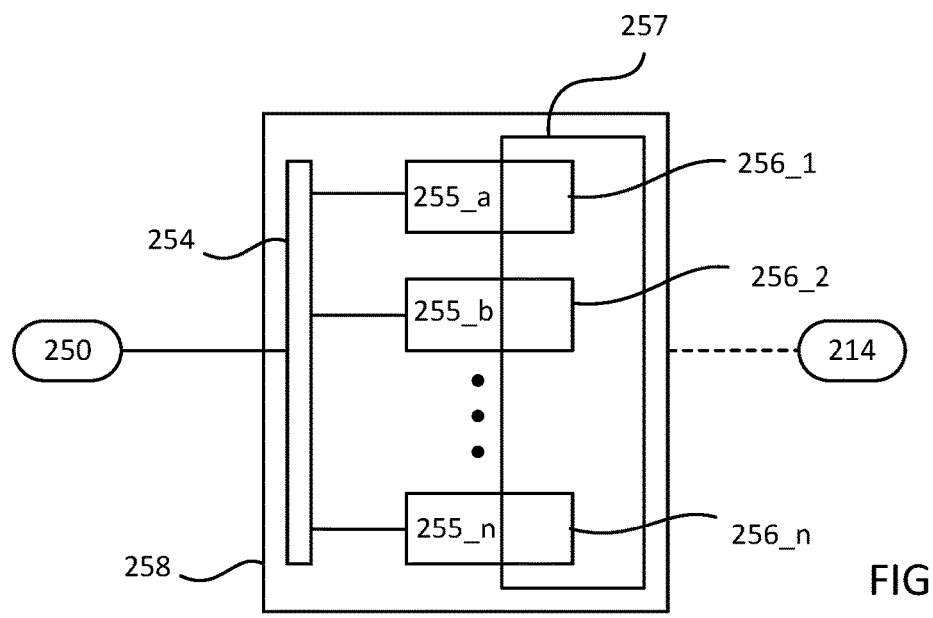
FIG. 2B is a block diagram of an example of an implementation of a spectral feature selection module that may be used in a photolithography system.
Figure 2C:
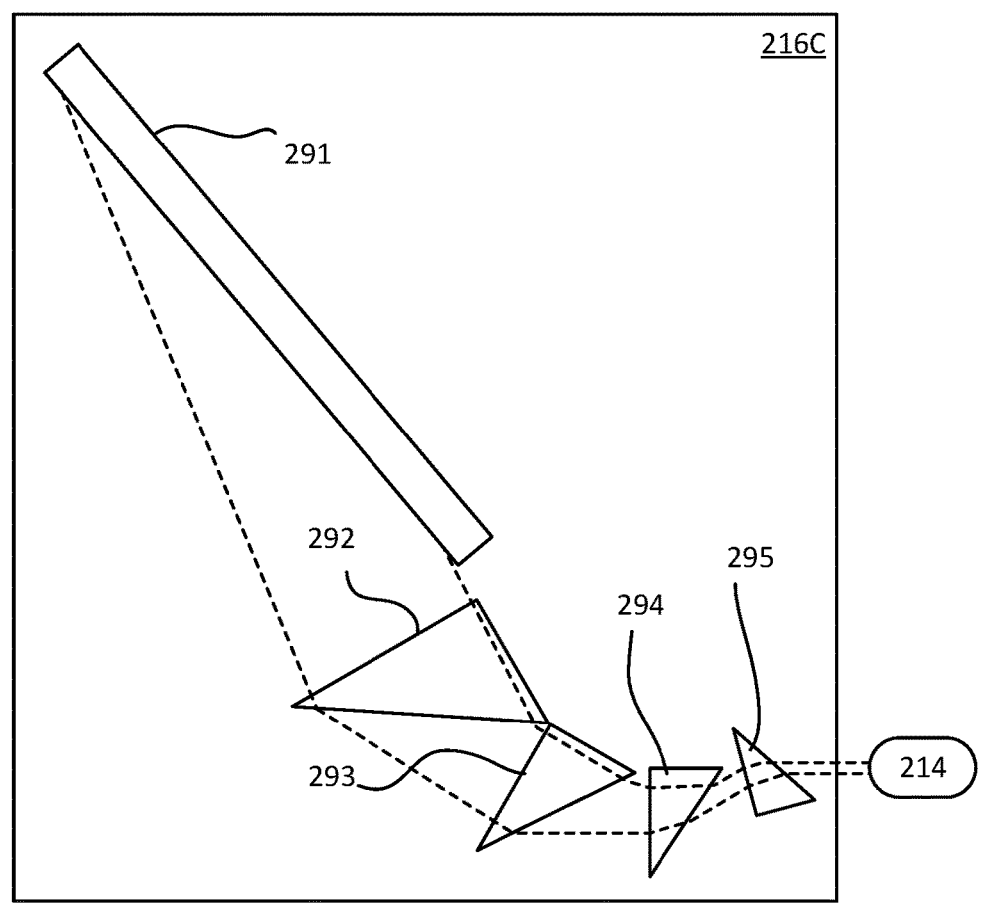
FIG. 2C is a block diagram of an example of an implementation of a line narrowing module.

The master oscillator 212 includes a discharge chamber 240 having two elongated electrodes 217, a gain medium 219 that is a gas mixture, and a fan for circulating gas between the electrodes 217. A resonator is formed between a line narrowing module 216 on one side of the discharge chamber 240 and an output coupler 218 on a second side of the discharge chamber 240. The line narrowing module 216 may include a diffractive optic such as a grating that finely tunes the spectral output of the discharge chamber 240. FIGS. 2B and 2C provide additional detail about the line narrowing module 216.

FIG. 2B is a block diagram of an example of an implementation of a spectral feature selection module 258 that includes one or more instances of the line narrowing module 216. The spectral feature selection module 258 couples to light that propagates in the optical source 205. In some implementations (such as shown in FIG. 2B), the spectral feature selection module 258 receives the light from the chamber 214 of the master oscillator 212 to enable the fine tuning of the spectral features such as wavelength and bandwidth within the master oscillator 212.

The spectral feature selection module 258 may include a control module such as a spectral feature control module 254 that includes electronics in the form of any combination of firmware and software. The control module 254 is connected to one or more actuation systems such as spectral feature actuation systems 255_1 to 255_$n$. Each of the actuation systems 255_1 to 255_$n$ may include one or more actuators that are connected to respective optical features 256_1 to 256_$n$ of an optical system 257. The optical features 256_1 to 256_$n$ are configured to adjust particular characteristics of the generated light beam 260 to thereby adjust the spectral feature of the light beam 260. The control module 254 receives a control signal from the control system 250, the control signal including specific commands to operate or control one or more of the actuation systems 255_1 to 255_$n$. The actuation systems 255_1 to 255_$n$ can be selected and designed to work together, that is, in tandem, or the actuation system 255_1 to 255_$n$ may be configured to work individually. Moreover, each actuation system 255_1 to 255_$n$ may be optimized to respond to a particular class of disturbances.

Each optical feature 256_1 to 256_$n$ is optically coupled to the light beam 260 produced by the optical source 105. The optical system 257 may be implemented as a line narrowing module 216C such as that shown in FIG. 2C. The line narrowing module includes as the optical features 256_1 to 256_$n$ dispersive optical elements such as a reflective gratings 291 and refractive optical elements such as prisms 292, 293, 294, 295. One or more of the prisms 292, 293, 294, 295 may be rotatable. An example of this line narrowing module can be found in U.S. application Ser. No. 12/605,306, titled SYSTEM METHOD AN APPARATUS FOR SELECTING AND CONTROLLING LIGHT SOURCE BANDWIDTH and filed on Oct. 23, 2009 (the '306 application). In the '306 application, a line narrowing module is described that includes a beam expander (including the one or more prisms 292, 293, 294, 295) and the dispersive element such as the grating 291. The respective actuation systems for the actuatable optical features such as the grating 291, and one or more of the prisms 292, 293, 294, 295 are not shown in FIG. 2C.

Each of the actuators of the actuation systems 255_1 to 255_$n$ is a mechanical device for moving or controlling the respective optical features 256_1 to 256_$n$ of the optical system 257. The actuators receive energy from the module 254, and convert that energy into some kind of motion imparted to the optical features 256_1 to 256_$n$ of the optical system 257. For example, in the '306 application, actuation systems are described such as force devices (to apply forces to regions of the grating) and rotation stages for rotating one or more of the prisms of the beam expander. The actuation systems 255_1 to 255_$n$ may include, for example, motors such as stepper motors, valves, pressure-controlled devices, piezoelectric devices, linear motors, hydraulic actuators, and/or voice coils.

Returning to FIG. 2A, the master oscillator 212 also includes a line center analysis module 220 that receives an output light beam from the output coupler 218 and a beam coupling optical system 222 that modifies the size or shape of the output light beam as needed to form the seed light beam 224. The line center analysis module 220 is a measurement system that may be used to measure or monitor the wavelength of the seed light beam 224. The line center analysis module 220 may be placed at other locations in the optical source 205, or it may be placed at the output of the optical source 205.

The gas mixture used in the discharge chamber 240 may be any gas suitable for producing a light beam at the wavelength and bandwidth required for the application. For an excimer source, the gas mixture may contain a noble gas (rare gas) such as, for example, argon or krypton, a halogen, such as, for example, fluorine or chlorine and traces of xenon apart from helium and/or neon as buffer gas. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. The excimer gain medium (the gas mixture) is pumped with short (for example, nanosecond) current pulses in a high-voltage electric discharge by application of a voltage to the elongated electrodes 217.

The power amplifier 230 includes a beam coupling optical system 232 that receives the seed light beam 224 from the master oscillator 212 and directs the light beam through a discharge chamber 240, and to a beam turning optical element 248, which modifies or changes the direction of the seed light beam 224 so that it is sent back into the discharge chamber 240. The discharge chamber 240 includes a pair of elongated electrodes 241, a gain medium 219 that is a gas mixture, and a fan for circulating the gas mixture between the electrodes 241.

The output light beam 260 is directed through a bandwidth analysis module 262, where various parameters (such as the bandwidth or the wavelength) of the beam 260 may be measured. The output light beam 260 may also be directed through a beam preparation system 263. The beam preparation system 263 may include, for example, a pulse stretcher, where each of the pulses of the output light beam 260 is stretched in time, for example, in an optical delay unit, to adjust for performance properties of the light beam that impinges the lithography exposure apparatus 169. The beam preparation system 263 also may include other components that are able to act upon the beam 260 such as, for example, reflective and/or refractive optical elements (such as, for example, lenses and mirrors), filters, and optical apertures (including automated shutters).

The photolithography system 200 also includes the control system 250. In the implementation shown in FIG. 2A, the control system 250 is connected to various components of the optical source 205. For example, the control system 250 may control when the optical source 205 emits a pulse of light or a burst of light pulses that includes one or more pulses of light by sending one or more signals to the optical source 205. The control system 250 is also connected to the lithography exposure apparatus 169. Thus, the control system 250 also may control the various aspects of the lithography exposure apparatus 169. For example, the control system 250 may control the exposure of the wafer 170 and thus may be used to control how electronic features are printed on the wafer 170. In some implementations, the control system 250 may control the scanning of the wafer 170 by controlling the motion of the slit 176 in the x-y plane (FIG. 1B). Moreover, the control system 250 may exchange data with the metrology system 172 and/or the optical system 175.

The lithography exposure apparatus 169 also may include, for example, temperature control devices (such as air conditioning devices and/or heating devices), and/or power supplies for the various electrical components. The control system 250 also may control these components. In some implementations, the control system 250 is implemented to include more than one sub-control system, with at least one sub-control system (a lithography controller) dedicated to controlling aspects of the lithography exposure apparatus 169. In these implementations, the control system 250 may be used to control aspects of the lithography exposure apparatus 169 instead of, or in addition to, using the lithography controller.

The control system 250 includes an electronic processor 251, an electronic storage 252, and an I/O interface 253. The electronic processor 251 includes one or more processors suitable for the execution of a computer program such as a general or special purpose microprocessor, and any one or more processors of any kind of digital computer. Generally, an electronic processor receives instructions and data from a read-only memory, a random access memory, or both. The electronic processor 251 may be any type of electronic processor.

The electronic storage 252 may be volatile memory, such as RAM, or non-volatile memory. In some implementations, and the electronic storage 252 includes non-volatile and volatile portions or components. The electronic storage 252 may store data and information that is used in the operation of the control system 250, components of the control system 250, and/or systems controlled by the control system 250. The information may be stored in, for example, a look-up table or a database. For example, the electronic storage 252 may store data that indicates values of various properties of the beam 260 under different operating conditions and performance scenarios.

Moreover, the electronic storage 252 may store various recipes or process programs 259 that dictate parameters of the light beam 260 during use. For example, the electronic storage 252 may store a recipe that indicates the wavelength of each pulse in the light beam 260 for a particular exposure pass. The recipe may indicate different wavelengths for different exposure passes. The wavelength controlling techniques discussed below may be applied on a pulse-by-pulse basis. In other words, the wavelength content may be controlled for each individual pulse in an exposure pass to facilitate formation of the aerial images at the desired locations along the z axis.

The electronic storage 252 also may store instructions, perhaps as a computer program, that, when executed, cause the processor 251 to communicate with components in the control system 250, the optical system 205, and/or the lithography exposure apparatus 169.

The I/O interface 253 is any kind of electronic interface that allows the control system 250 to receive and/or provide data and signals with an operator, the optical system 205, the lithography exposure apparatus 169, any component or system within the optical system 205 and/or the lithography exposure apparatus 169, and/or an automated process running on another electronic device. For example, the I/O interface 253 may include one or more of a visual display, a keyboard, and a communications interface.

Figure 3A:
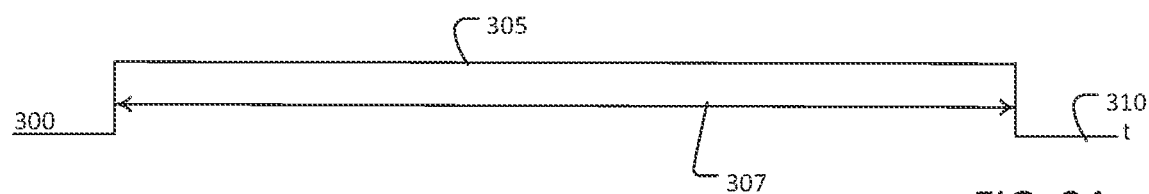
Figure 3B:
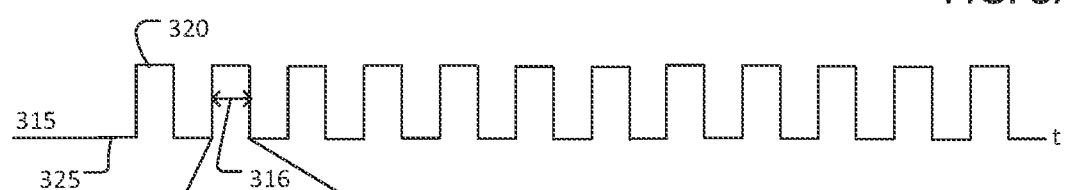
Figure 3C:
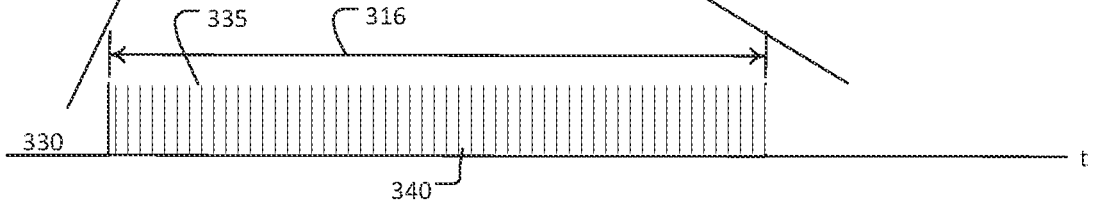

The light beam 260 (and the light beam 160) are pulsed light beams and may include one or more bursts of pulses that are separated from each other in time. Each burst may include one or more pulses of light. In some implementations, a burst includes hundreds of pulses, for example, 100-400 pulses. FIGS. 3A-3C provides an overview of the production of pulses and bursts in the optical source 205. FIG. 3A shows an amplitude of a wafer exposure signal 300 as a function of time, FIG. 3B shows an amplitude of a gate signal 315 as a function of time, and FIG. 3C shows an amplitude of a trigger signal as a function of time.

The control system 250 may be configured to send the wafer exposure signal 300 to the optical source 205 to control the optical source 205 to produce the light beam 260. In the example shown in FIG. 3A, the wafer exposure signal 300 has a high value 305 (for example, 1) for a period of time 307 during which the optical source 205 produces bursts of pulses of light. The wafer exposure signal 300 otherwise has a low value 310 (for example, 0) when the wafer 170 is not being exposed.

Referring to FIG. 3B, the light beam 260 is a pulsed light beam, and the light beam 260 includes bursts of pulses. The control system 250 also controls the duration and frequency of the bursts of pulses by sending a gate signal 315 to the optical source 205. The gate signal 315 has a high value 320 (for example, 1) during a burst of pulses and a low value 325 (for example, 0) during the time between successive bursts. In the example shown, the duration of time at which the gate signal 315 has the high value is also the duration of a burst 316. The bursts are separated in time by an inter-burst time interval. During the inter-burst time interval, the lithography exposure apparatus 169 may position the next die on the wafer 170 for exposure.

Referring to FIG. 3C, the control system 250 also controls the repetition rate of the pulses within each burst with a trigger signal 330. The trigger signal 330 includes triggers 340, one of which is provided to the optical source 205 to cause the optical source 205 to produce a pulse of light. The control system 250 may send a trigger 340 to the source 205 each time a pulse is to be produced. Thus, the repetition rate of the pulses produced by the optical source 205 (the time between two successive pulses) may be set by the trigger signal 330.

As discussed above, when the gain medium 219 is pumped by applying voltage to the electrodes 217, the gain medium 219 emits light. When voltage is applied to the electrodes 217 in pulses, the light emitted from the medium 219 is also pulsed. Thus, the repetition rate of the pulsed light beam 260 is determined by the rate at which voltage is applied to the electrodes 217, with each application of voltage producing a pulse of light. The pulse of light propagates through the gain medium 219 and exits the chamber 214 through the output coupler 218. Thus, a train of pulses is created by periodic, repeated application of voltage to the electrodes 217. The trigger signal 330, for example, may be used to control the application of voltage to the electrodes 217 and the repetition rate of the pulses, which may range between about 500 and 6,000 Hz for most applications. In some implementations, the repetition rate may be greater than 6,000 Hz, and may be, for example, 12,000 Hz or greater The signals from the control system 250 may also be used to control the electrodes 217, 241 within the master oscillator 212 and the power amplifier 230, respectively, for controlling the respective pulse energies of the master oscillator 212 and the power amplifier 230, and thus, the energy of the light beam 260. There may be a delay between the signal provided to the electrodes 217 and the signal provided to the electrodes 241. The amount of delay may influence properties of the beam 260, such as the amount of coherence in the pulsed light beam 260.

The pulsed light beam 260 may have an average output power in the range of tens of watts, for example, from about 50 W to about 130 W. The irradiance (that is, the average power per unit area) of the light beam 260 at the output may range from 60 W/cm² to 80 W/cm².

Figure 4:
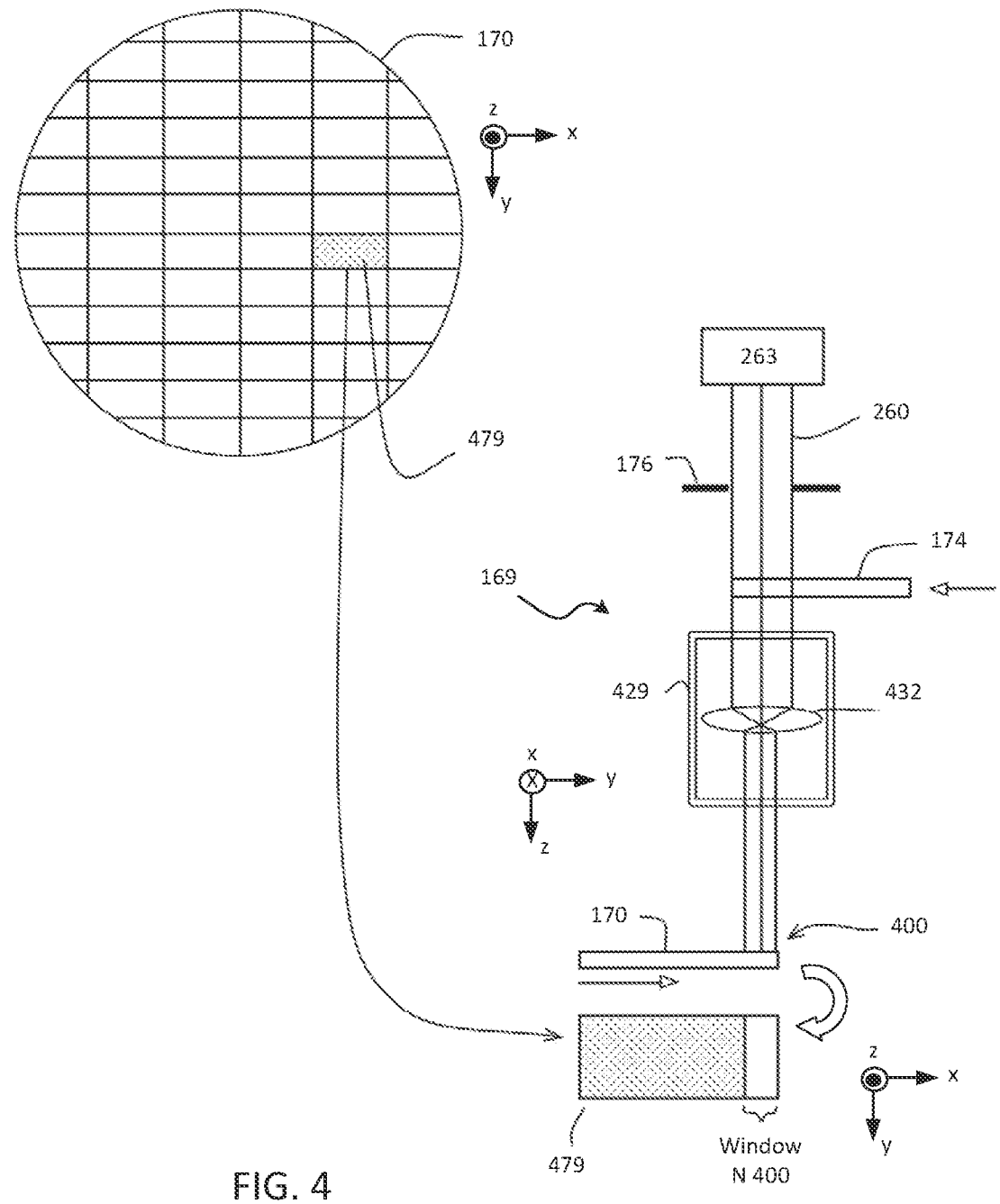
FIG. 4 is a block diagram of another example of an implementation of a photolithography system.

Referring also to FIG. 4, the wafer 170 is irradiated by the light beam 260. The lithography exposure apparatus 169 includes the optical system 175 (FIGS. 1A and 1B). In the example of FIG. 4, the optical system 175 (not shown) includes an illuminator system 429, which includes an objective arrangement 432. The objective arrangement 432 includes the projection lens 177 (FIG. 1B) and enables the image transfer to occur from the mask 174 to the photoresist on the wafer 170. The illuminator system 429 adjusts the range of angles for the light beam 260 impinging on the mask 174. The illuminator system 429 also may homogenize (make uniform) the intensity distribution of the light beam 260 in the x-y plane across the mask 174.

In some implementations, an immersion medium may be supplied to cover the wafer 170. The immersion medium may be a liquid (such as water) for liquid immersion lithography. In other implementations in which the lithography is a dry system, the immersion medium may be a gas such as dry nitrogen, dry air, or clean air. In other implementations, the wafer 170 may be exposed within a pressure-controlled environment (such as a vacuum or partial vacuum).

During an exposure pass, a plurality of N pulses of the light beam 260 illuminates the same area of the wafer 170. N may be any integer number greater than one. The number of pulses N of the light beam 110 that illuminate the same area may be referred to as an exposure window or exposure pass 400. The size of the window 400 may be controlled by the slit 176. For example, the slit 176 may include a plurality of blades that are movable such that the blades form an aperture in one configuration and close the aperture in another configuration. By arranging the blades of the slit 176 to form an aperture of a particular size, the size of the window 400 also may be controlled.

The N pulses also determine an illumination dose for the exposure pass. The illumination dose is the amount of optical energy that is delivered to the wafer during the exposure pass. Thus, properties of the N pulses, such as the optical energy in each pulse, determine the illumination dose. Moreover, and as discussed in greater detail below, the N pulses also may be used to determine the amount of light in each of the aerial images 173a, 173b. In particular, a recipe may specify that of the N pulses, a certain number of pulses have a first primary wavelength that forms the aerial image 173a and a certain number of pulses have a second primary wavelength that forms the aerial image 173b.

Additionally, the slit 176 and/or the mask 174 may move in in a scanning direction in the x-y plane such that only a portion of the wafer 170 is exposed at a given time or during a particular exposure scan (or exposure pass). The size of the area on the wafer 170 exposed by the light beam 160 is determined by the distance between the blades in the non-scanning direction and by the length (distance) of the scan in the scanning direction. In some implementations, the value of N is in the tens, for example, from 10-100 pulses. In other implementations, the value of N is greater than 100 pulses, for example, from 100-500 pulses. An exposure field 479 of the wafer 170 is the physical area of the wafer 170 that is exposed in one scan of an exposure slit or window within the lithography exposure apparatus 169.

The wafer stage 171, the mask 174, and the objective arrangement 432 are fixed to associated actuation systems to thereby form a scanning arrangement. In the scanning arrangement, one or more of the mask 174, the objective arrangement 432, and the wafer 170 (via the stage 171) may move relative to each other in the x-y plane. However, aside from incidental relative operational motion between the wafer stage 171, the mask 174, and the objective arrangement 432, these elements are not moved relative to each other along the z axis during an exposure pass or an exposure pass.

Figure 5:
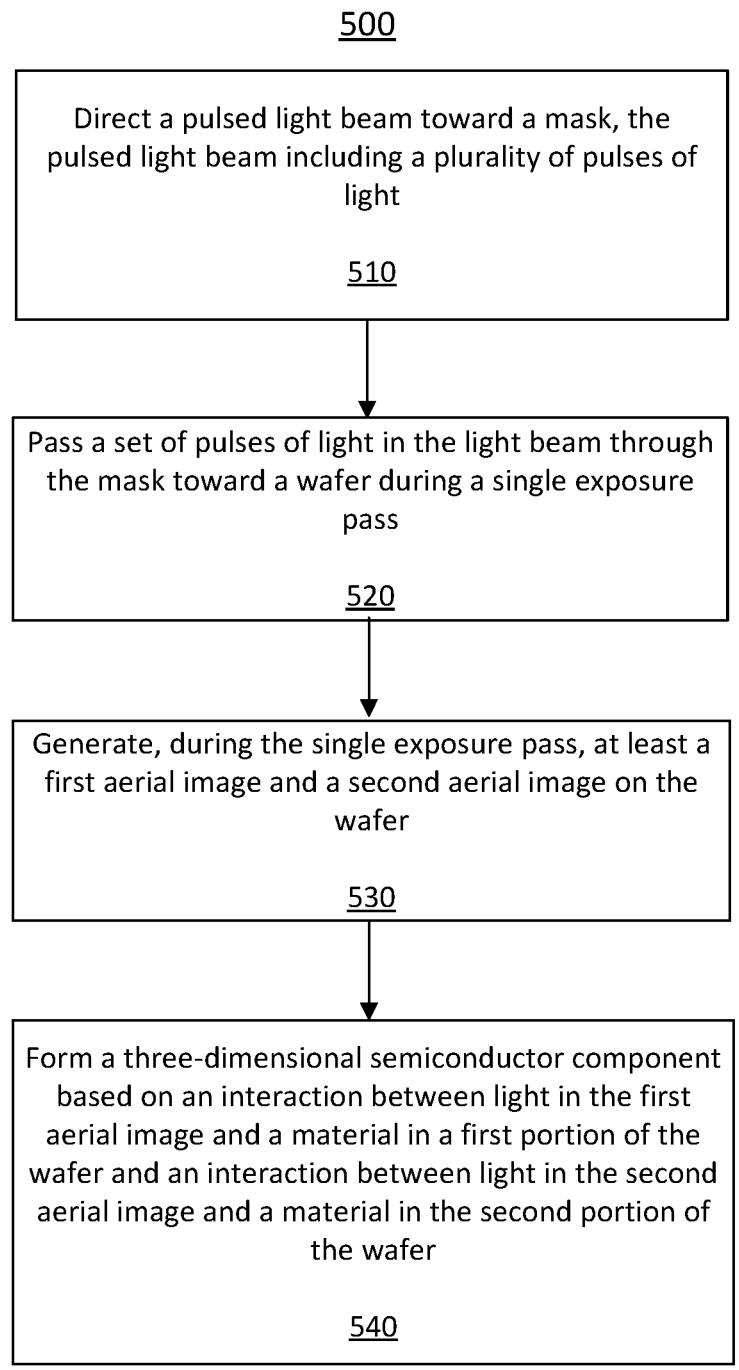
FIG. 5 is a flow chart of an example of a process for forming a three-dimensional semiconductor component.

Referring to FIG. 5, a flow chart of a process 500 is shown. The process 500 is an example of a process for forming a three-dimensional semiconductor component or a portion of such a component. The process 500 may be performed using the photolithography system 100 or 200. The process 500 is discussed with respect to the system 200 shown in FIG. 2A. The process 500 is also discussed with respect to FIGS. 6A-10B.

Figure 6A:
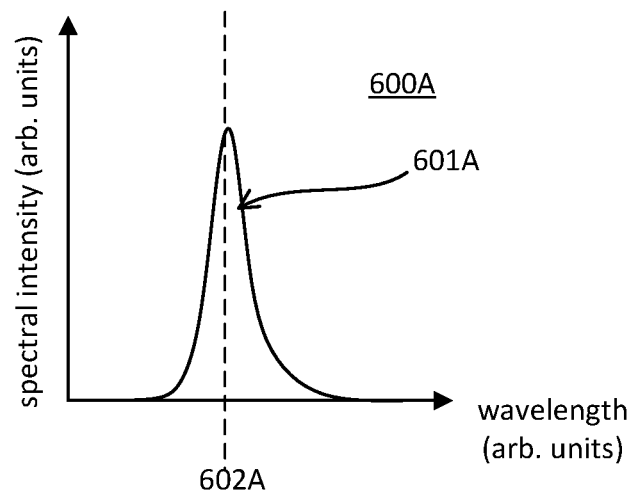
FIGS. 6A and 6B each show an example of an optical spectrum of a single pulse of light.
Figure 6B:
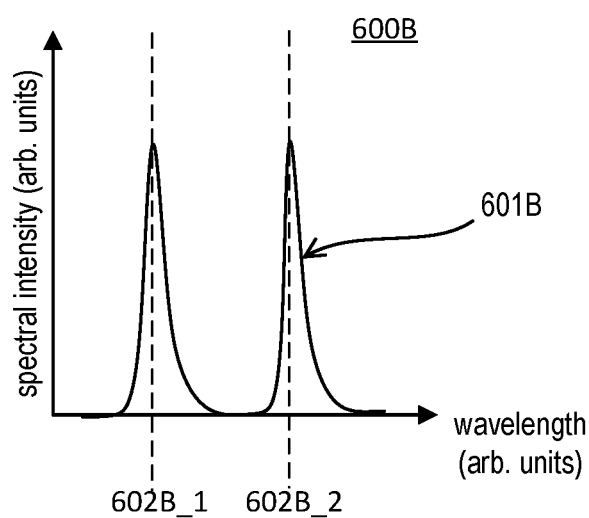

The light beam 260 is directed toward the mask 174 (510). The light beam 260 is a pulsed light beam that includes a plurality of pulses, each of which are separated from each other in time such as shown in FIG. 3C. FIGS. 6A and 6B show examples of optical spectra of a single pulse that is part of the light beam 260. Other pulses in the light beam 260 may have different optical spectra.

Referring to FIG. 6A, an optical spectrum 601A of a pulse of light 600A is shown. The pulse of light 600A has non-zero intensity within a band of wavelengths. The band of wavelengths also may be referred to as the bandwidth of the pulse 600A.

The information shown in FIG. 6A is the instantaneous optical spectrum 601A (or emission spectrum) of the pulse 600A. The optical spectrum 601A contains information about how the optical energy or power of a pulse of the light beam 260 is distributed over different wavelengths (or frequencies). The optical spectrum 601A is depicted in the form of a diagram where the spectral intensity (not necessarily with an absolute calibration) is plotted as a function of the wavelength or optical frequency. The optical spectrum 601A may be referred to as the spectral shape or intensity spectrum of a pulse of the light beam 260. The pulse 600A has a primary wavelength 602A, which, in the example of FIG. 6A, is the peak intensity. Although the discussion of the pulses of the light beam 260 and the aerial images formed by the pulses of the light beam 260 refers to the primary wavelengths of the pulses, the pulses include wavelengths other than the primary wavelength and the pulses have a finite bandwidth that may be characterized by a metric. For example, the full width of the spectrum 601A at a fraction (X) of the maximum peak intensity of the spectral shape (referred to as FWXM) may be used to characterize the light beam bandwidth. As another example, the width of the spectrum that contains a fraction (Y) of the integrated spectral intensity (referred to as EY) may be used to characterize the light beam bandwidth.

The pulse 600A is shown as an example of a pulse that may be in the light beam 260. When the pulse 600A is used to expose a portion of the wafer 120, the light in the pulse forms an aerial image. The location of the aerial image in the z direction (FIGS. 1C and 4) is determined by the value of the primary wavelength 602A. The various pulses in the light beam 260 may have different primary wavelengths. For example, to generate two aerial images during a single exposure pass, some of the pulses of the light beam 260 have one primary wavelength (a first primary wavelength) and the other pulse of the light beam 260 have another primary wavelength (a second primary wavelength). The first and second primary wavelengths are different wavelengths. The wavelength difference between the first and second primary wavelengths may be referred to as the spectral separation.

The spectral separation may be, for example, 200 femtometers (fm) to 5 picometers (pm). Although the wavelengths of the various pulses in the light beam 260 may be different, the shape of the optical spectra of the pulses may be the same.

The light source 205 may dither or switch the primary wavelength between the first and second primary wavelengths on a pulse-to-pulse basis such that every pulse has a different primary wavelength than a pulse that immediately precedes or follows the pulse in time. In these implementations, assuming that all of the pulses in the light beam 260 have the same intensity, distributing the first and second primary wavelengths in this manner results in two aerial images at different locations in the z direction with the same intensity.

In some implementations, a certain portion (for example, 33%) of the pulses have the first primary wavelength, and the remainder (67% in this example) have the second primary wavelength. In these implementations, assuming that all of the pulses in the light beam 260 have the same intensity, two aerial images are formed of different intensities. The aerial image formed by the pulses having the first primary wavelength has about half of the intensity of the aerial image formed by the pulses having the second primary wavelength. In this way, the dose provided to a particular location in the wafer 170 along the z axis may be controlled by controlling the portion of the N pulses that have each of the first and second primary wavelengths.

The portion of pulses that are to have a particular primary wavelength for an exposure pass may be specified in a recipe file 259 that is stored on the electronic storage 252. The recipe 259 specifies the ratio of the various primary wavelengths for an exposure pass. The recipe 259 also may specify the ratio for other exposure passes, such that a different ratio may be used for other exposure passes and the aerial images may be adjusted or controlled on a field-by-field basis.

Referring to FIG. 6B, an optical spectrum 601B of a pulse 600B is shown. The pulse 600B is another example of a pulse of the light beam 260. The optical spectrum 601B of the pulse 600B has a different shape than the optical spectrum 601A. In particular, the optical spectrum 601B has two peaks that correspond to two primary wavelengths 602B_1 and 602B_2 of the pulse 600B. The pulse 600B is part of the light beam 260. When the pulse 600B is used to expose a portion of the wafer 120, the light in the pulse forms two aerial images at different locations along the z axis on the wafer. The locations of the aerial images are determined by the wavelengths of the primary wavelengths 602B_1 and 602B_2.

The pulses shown in FIGS. 6A and 6B may be formed by any hardware capable of forming such pulses. For example, a pulse train of pulses such as the pulse 600A may be formed using a line narrowing module similar to the line narrowing module 216C of FIG. 2C. The wavelength of the light diffracted by the grating 291 depends on the angle of the light that is incident on the grating. A mechanism to change the angle of incidence of light that interacts with the grating 291 may be used with such a line narrowing module to create a pulse train with N pulses for an exposure pass, where at least one of the N pulses has a primary wavelength that is different from the primary wavelength of another pulse of the N pulses. For example, one of the prisms 292, 293, 294, 295 may be rotated to change the angle of light that is incident on the grating 291 on a pulse-by-pulse basis. In some implementations, the line narrowing module includes a mirror that is in the path of the beam 260 and is movable to change the angle of light that is incident on the grating 291. An example of such an implementation is discussed, for example, in U.S. Pat. No. 6,192,064, titled NARROW BAND LASER WITH FINE WAVELENGTH CONTROL, issued on Feb. 20, 2001.

A pulse such as the pulse 600B (FIG. 6B) also may be formed using a line narrowing module similar to the line narrowing module 216C of FIG. 2C. For example, a stimulated optical element, such as an acousto-optic modulator, may be placed in the line narrowing module 216C in the path of the beam 260. The acousto-optic modulator deflects incident light at an angle that depends on the frequency of an acoustic wave used to excite the modulator. An acoustic modulator includes a material, such as glass or quartz, that allows acoustic waves to propagate, and a transducer coupled to the material. The transducer vibrates in response to an excitation signal and the vibrations create acoustic waves in the material. The acoustic waves form moving planes of expansion and compression that change the index of refraction of the material. As a result, the acoustic waves act as a diffraction grating such that incident light is diffracted and exits the material at several different angles simultaneously. Light from two or more of the orders may be allowed to reach the grating 291, and the light in each of the various diffraction orders has a different angle of incidence on the grating 291. In this way, a single pulse that includes two or more primary wavelengths may be formed. An example of a line narrowing module that includes an acousto-optic modulator is discussed, for example, in U.S. Pat. No. 7,154,928, titled LASER OUTPUT BEAM WAVEFRONT SPLITTER FOR BANDWIDTH SPECTRUM CONTROL, issued on Dec. 26, 2006.

A set of pulses of light are passed through the mask 174 toward the wafer 170 during a single exposure pass (520). As discussed above, N pulses of light may be provided to the wafer 170 during the exposure pass. The N pulses of light may be consecutive pulses of light in the beam 260. The exposed portion of the wafer 170 sees an average of the optical spectrum of each of the N pulses over the exposure pass. Thus, if a portion of the N pulses have a first primary wavelength and the remaining N pulses have a second primary wavelength, the average optical spectrum at the wafer 170 will be an optical spectrum that includes a peak at the first primary wavelength and a peak at the second primary wavelength. Similarly, if all or some of the individual pulses of the N pulses have more than one primary wavelength, those primary wavelengths may form peaks in the average optical spectrum. FIG. 7 shows an example of an average optical spectrum 701 at the wafer 170. The averaged optical spectrum 701 includes a first primary wavelength 702_1 and a second primary wavelength 702_2. In the example of FIG. 7, the first primary wavelength 702_1 and the second primary wavelength 702_2 are separated by a spectral separation 703 of about 500 fm however other combinations can also be considered. The spectral separation 703 is such that the first primary wavelength 702_1 and the second primary wavelength 702_2 are distinct, and the average optical spectrum 701 includes a spectral region 704 of little to no intensity between the wavelengths 702_1 and 702_2.

Two or more aerial images, for example, the first based on the first primary wavelength and the second based on the second primary wavelength, are formed at the wafer 170 based on the average optical spectrum (530). Continuing the example of the averaged optical spectrum 701 and referring also to FIG. 8A, two aerial images 873a and 873b are formed in a single exposure pass based on the N pulses. The N pulses include pulses that have the first primary wavelength 702_1 and pulses that have the second primary wavelength 702_2. The pulses that have the first primary wavelength 702_1 form the first aerial image 873a, and the pulses that have the second primary wavelength 702_2 form the second aerial image 873b. The aerial image 873a is formed at a first plane 878a, and the aerial image 873b is formed at a second plane 878b. The planes 878a and 878b are perpendicular to a direction of propagation of the light beam 260 at the wafer 170. The planes 878a and 878b are separated along the z direction by a separation distance 879.

The separation distance 879 is larger than the depth of focus of the lithography apparatus 169 for an averaged optical spectrum that has a single primary wavelength. The depth of focus may be defined for a dose value (an amount of optical energy provided to the wafer) as the range of focus along the z direction at which that dose provides a feature size that is within an acceptable range of feature sizes for the process that is being applied to the wafer 170. The process 500 is able to increase the depth of focus of the lithography exposure apparatus 169 by providing more than one distinct aerial image at the wafer 170 during a single exposure pass. This is because the plurality of aerial images are each able to expose the wafer at a different location in the z direction with features that are within the acceptable range of feature sizes. In other words, the process 500 is able to provide the lithography exposure apparatus 169 with a greater rage of depth of focus during a single exposure pass. As discussed above, the operator of the lithography exposure apparatus 169 may control various parameters of the exposure process through the recipe file 259. In some implementations, the operator of the lithography exposure apparatus 169 may receive information from a simulation program, such as the Tachyon Source-Mask Optimization (SMO) available from Brion, an ASML Company, and this information may be used to program or otherwise specify the parameters of the recipe file 259. For example, the operator of the lithography exposure apparatus 169 may know that an upcoming lot is not going to require as much depth of focus as previously exposed lot. In this example, the operator may specify a depth of focus and a dose variation to the simulation program, and the simulation program returns the value of the spectral separation 703 to achieve the desired parameters. The operator may then specify the value of the spectral separation 703 for the upcoming lot by programing the recipe file 259 through the I/O interface 253. In some implementations, the operator may use the simulation to determine whether or not a greater depth of focus (such as is possible by exposing the wafer 170 with a plurality of aerial images at distinct planes) is needed for a particular exposure pass. In instances in which the greater depth of focus is not required to form a particular portion of the semiconductor component, the recipe file 259 may be structured so that, for example, the exposure pass used to form that particular portion of the semiconductor component has an averaged optical spectrum that includes a single primary wavelength.

Moreover, the operator and/or simulator may receive information about the formed three-dimensional component as measured by the metrology system 172 or by another sensor. For example, the metrology system 172 may provide data relating to a sidewall angle of the formed 3D semiconductor component and the data may be used to program parameters in the recipe file 259 for a subsequent exposure pass.

FIG. 8B shows the aerial image 873a in the x-y plane (looking into the page in FIG. 8A) at the plane 878a. The aerial images 873a and 873b are generally two-dimensional intensity patterns that are formed in the x-y plane. The nature of the intensity pattern depends on the characteristics of the mask 174. The first and second planes 878a, 878b are portions of the wafer 170. As illustrated in FIG. 8B, the first plane 878a may be only a small portion of the entire wafer 170.

The value of the separation distance 879 depends on the spectral separation 703 and on properties of the optical system 275. For example, the value of the separation distance 879 may depend on the focal length, aberration, and other properties of lenses and other optical elements in the optical system 275. For a scanner lens with a chromatic aberration C, the separation distance 879 may be determined from Equation 1:

$$\Delta D = C * \Delta \lambda.$$  Equation (1), where $\Delta D$ is the separation distance 879 in nanometers (nm), C is the chromatic aberration (defined as the distance the focal plane moves in the propagation direction for a wavelength change), and $\Delta \lambda$, is the spectral separation 873 in picometers. The separation distance 875 may be, for example, 5000 nm (5 μm), and the spectral separation 873 may be about 200-300 fm.

Moreover, due to variations in manufacturing and installation processes and/or modifications made by end users, different primary wavelengths may be required to achieve a desired separation distance 879 for a particular instance of a certain type of exposure apparatus 169. As discussed above, a recipe or process control program 259 may be stored on the electronic storage 252 of the control system 250. The recipe 259 may be modified or programmed to be customized to a particular exposure apparatus or a type of exposure apparatus. The recipe 259 may be programmed when the lithography system 200 is manufactured and/or the recipe 259 may be programmed via, for example, the I/O interface 253, by an end user or other operator familiar with the performance of the system 200.

The recipe 259 also may specify a different separation distance 879 for different exposure passes used to expose different areas of the wafer 170. Additionally or alternatively, the recipe 259 may specify the separation distance 879 on a per-lot or per-layer basis or on a per-wafer basis. A lot or a layer is a group of wafers that are processed by the same exposure apparatus under the same nominal conditions. The recipe 259 also allows specification of other parameters related to the aerial images 873a, 873b, such as the dose provided by each image. For example, the recipe 259 may specify a ratio of the number of pulses in the N pulses that have the first primary wavelength 702_1 to the number of pulses that have the second primary wavelength 702_2. These other parameters also may be specified on a per-field, per-lot (or per-layer), and/or per-wafer basis.

Moreover, the recipe 259 may specify that some layers are not exposed with the first primary wavelength 702_1 and the second primary wavelength 702_2 and are instead exposed with a pulse that has an optical spectrum that includes a single primary wavelength. Such an optical spectrum may be used, for example, when a planar semiconductor component is to be formed instead of a three-dimensional semiconductor component. The I/O interface 253 allows an end-user and/or manufacturer to program or create the recipe to specify the number of primary wavelengths, including a scenario in which a single primary wavelength is used, for example, for a particular layer or lot.

Additionally, although the example above discusses the average optical spectrum 701 having two primary wavelengths, in other examples, the average optical spectrum 701 may have more than two primary wavelengths (for example, three, four, or five primary wavelengths), each of which are separated from the nearest other primary wavelength by a spectral separation and a region such as the region 704. The I/O interface 253 allows an end-user and/or manufacturer to program or create the recipe to specify these parameters.

Figure 9A:
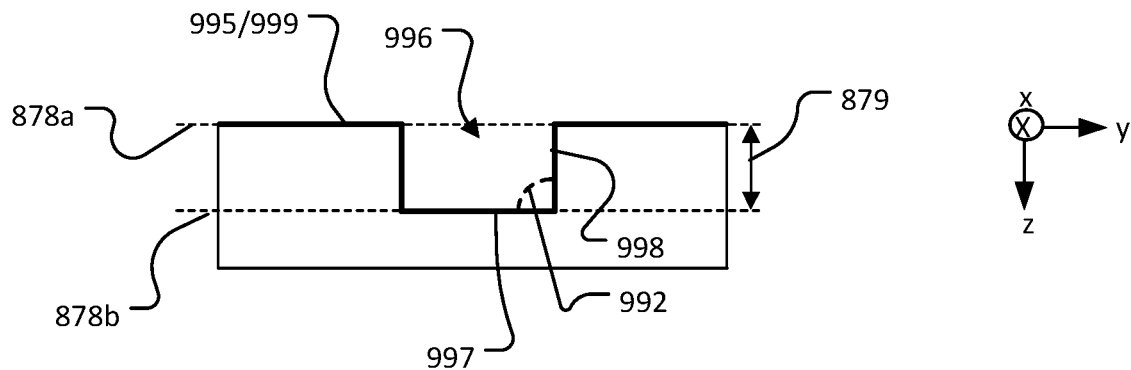
FIGS. 9A and 9B show side and top cross-sectional views, respectively, of an example of a three-dimensional semiconductor component.
Figure 9B:
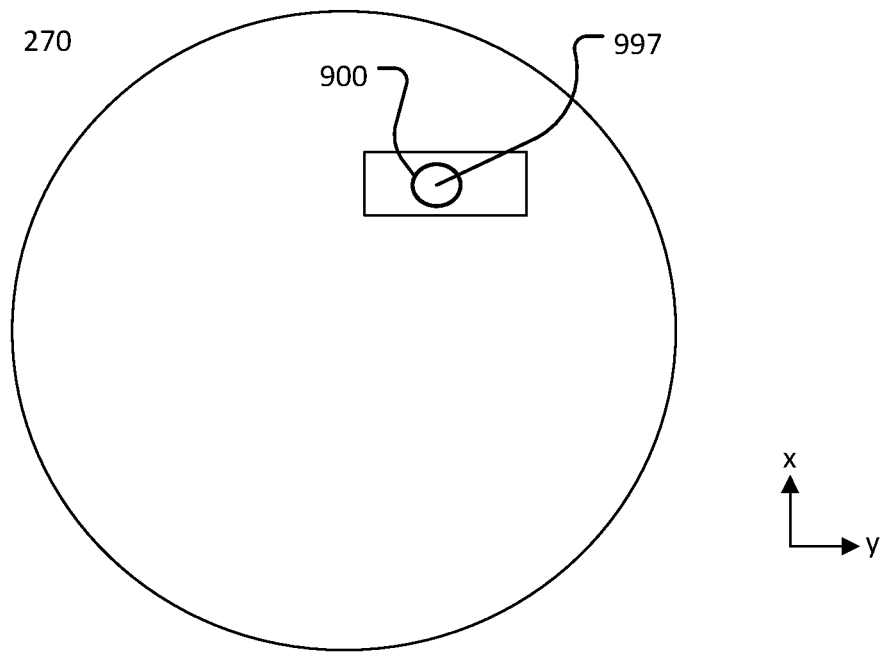

A three-dimensional (3D) semiconductor component is formed (540). FIG. 9A shows a cross-sectional view of an example of a 3D semiconductor component 995. FIG. 9B shows the wafer 170 and the component 995 in the x-y plane at the first plane 878a. The 3D semiconductor component 995 may be a complete component or a portion of a larger component. The 3D semiconductor component 995 may be any type of semiconductor component that has features that are not all formed at one z location in the wafer 170. For example, the 3D semiconductor component may be a device that includes recesses or openings that extend along the z axis. The 3D semiconductor component may be used for any type of electronic application. For example, the 3D semiconductor component may be all or part of a 3D NAND flash memory component. A 3D NAND flash memory is a memory in which memory cells are stacked along the z axis in layers.

In the example of FIG. 9A, the 3D semiconductor component 995 includes a recess 996 that is formed in a periphery 999. The recess 996 includes a floor 997 and a sidewall 998, which extends generally along the z axis between the periphery 999 and the floor 997. The floor 997 is formed by exposing photoresist at the plane 878b with light that is in the second aerial image 873b (FIG. 8A). Features on the periphery 999 are formed using light that is in the first aerial image 873a (FIG. 8A).

Using the process 500 also may result in a sidewall angle 992 being equal to 90° or closer to 90° than is possible with other processes. The sidewall angle 992 is the angle between the floor 997 and the sidewall 998. If the sidewall 998 extends in the x-z plane and the floor extends in the x-y plane, the sidewall angle 992 is 90° and may be considered vertical in this example. A vertical sidewall angle is desirable because, for example, such a sidewall allows for more well-defined features in a 3D semiconductor component. The process 500 achieves a sidewall angle 992 that is equal or close to 90° because the locations of the first aerial image 873a and the second aerial image 873b (the first plane 878a and the second plane 878b, respectively) are separate images that are in different parts of the wafer 170. Forming separate aerial images in a single exposure pass allows the quality of each of the images to be improved resulting in a more defined feature that is more vertically oriented as compared to a feature formed by a single aerial of lower quality.

Figure 10A:
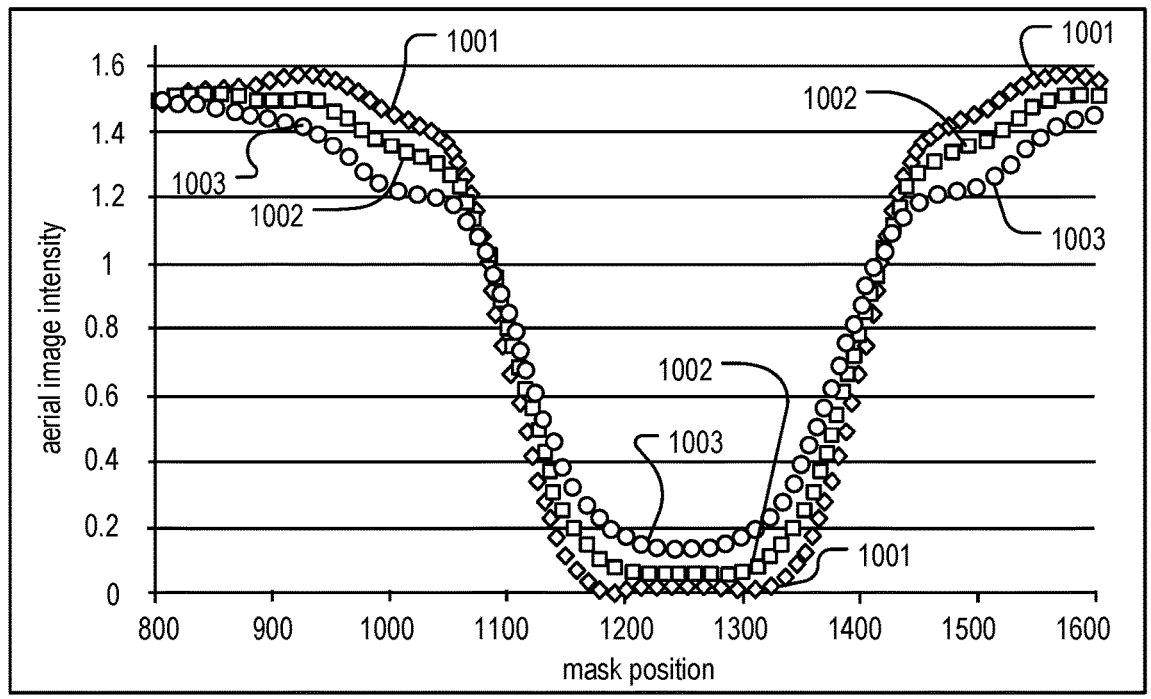
FIGS. 10A and 10B show examples of simulated data.
Figure 10B:
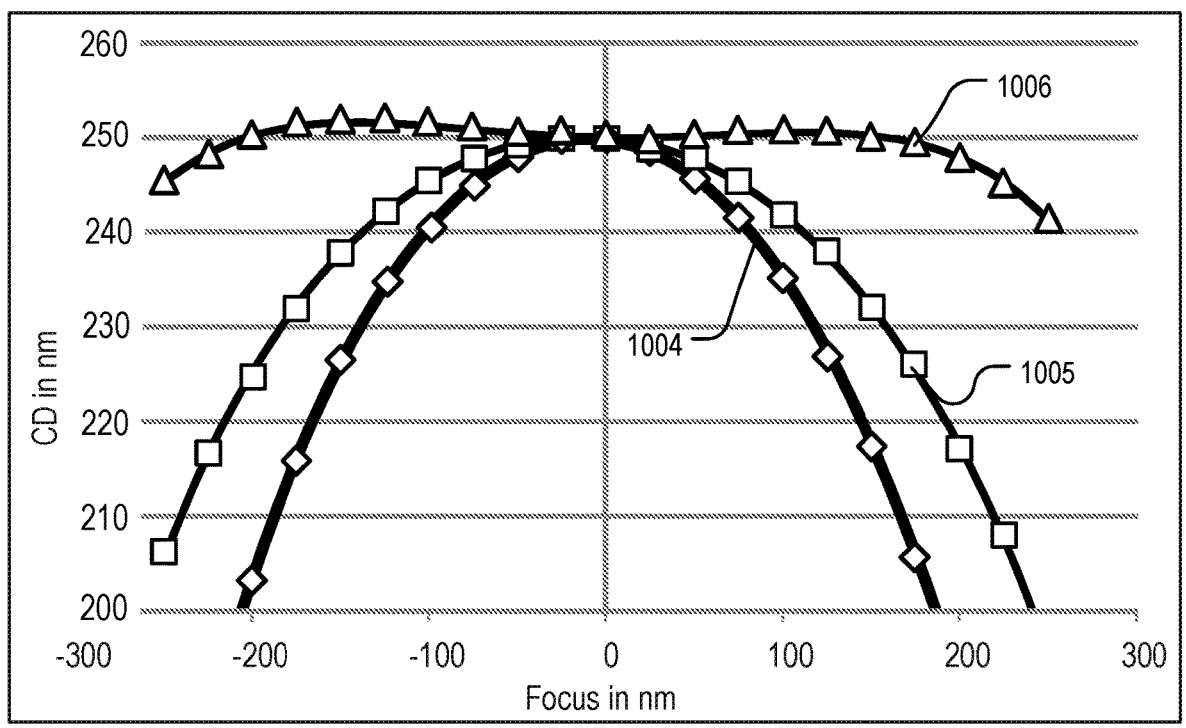

FIGS. 10A and 10B are examples of simulated data relating to the process 500. FIG. 10A shows three plots 1001, 1002, 1003 of aerial image intensity versus mask position along the y axis (FIG. 9A). Each of the plots 1001, 1002, 1003 represents intensity versus mask position for one aerial image. In FIG. 10A, the plot 1001 represents a simulation of an average optical spectrum that forms two aerial images during a single exposure pass, such as discussed above with respect to FIG. 5. The plot 1002 represents a simulation of a situation in which the wafer stage is tilted according to ASML's EFESE technique, which is a procedure for increasing the depth of focus to facilitate the printing of three-dimensional features (such as vias and holes) on a wafer. In the EFESE technique, the wafer stage is tilted at an angle to scan the aerial image through the focus while exposing the wafer. The EFESE technique generally results in a greater depth of focus. In FIG. 10A, only the plot 1002 represents data simulated using the EFESE technique. The remaining data shown on FIG. 10A did not employ the EFESE technique. The plot 1003 represents data from a simulation of a best focus based on dose.

The aerial image intensity as a function of mask position shown in FIG. 10A illustrates that forming two or more aerial images in a single exposure pass may produce similar contrast as tilting the wafer stage. A greater contrast indicates that the three-dimensional features that are at different locations along the z axis (FIG. 8A) are more likely to be properly formed.

FIG. 10B shows three plots 1004, 1005, 1006 of critical dimension as a function of the focus position for three different aerial images, with each aerial image averaged over an exposure pass. In FIG. 10B, the plot 10004 represents data from a simulation in which no EFESE technique was applied and a single aerial image was formed. The plot 1005 represents data from a simulation in which the EFESE technique was applied. As shown, the EFESE technique increases the depth of focus as compared to the no-EFESE simulation because the critical dimension value remains the same for a further distance from zero focus. The plot 1005 represents data from a simulation in which two aerial images were generated in a single exposure pass and no EFESE technique was employed. The depth of focus for the no-EFESE simulations using multiple aerial images are on par or better than the EFESE technique. Thus, the process 500 may be used to achieve a greater depth of focus in a single exposure pass without relying on a technique such as EFESE.

The embodiments may further be described using the following clauses:

1. A method of forming a three-dimensional semiconductor component using a photolithography system, the method comprising:
   directing a pulsed light beam along a direction of propagation toward a mask, the pulsed light beam comprising a plurality of pulses of light;
   passing a set of the pulses of light in the light beam through the mask toward a wafer during a single exposure pass;
   generating, during the single exposure pass, at least a first aerial image and a second aerial image on the wafer based on pulses of light in the set of pulses that pass through the mask, the first aerial image being at a first plane on the wafer and the second aerial image being at a second plane on the wafer, the first plane and the second plane being separated from each other by a separation distance along the direction of propagation; and
   patterning, in photoresist, the three-dimensional semiconductor component based on an interaction between light in the first aerial image and a material in a first portion of the wafer and an interaction between light in the second aerial image and a material in a second portion of the wafer, wherein
   at least one of the pulses in the set of pulses has a first primary wavelength and at least one of the other pulses in the set of pulses has a second primary wavelength that is different from the first primary wavelength, such that spectra of the first and second set of pulses are spectrally distinct and the separation distance is based on the difference between the first primary wavelength and the second primary wavelength.

2. The method of clause 1, wherein at least one of the pulses in the set of pulses that passes through the mask during the single exposure pass comprises more than one primary wavelength of light.

3. The method of clause 2, wherein each primary wavelength is separated by a spectral separation of 200 femtometers (fm) to 500 picometers (pm) from the nearest other primary wavelength.

4. The method of clause 1, wherein the separation distance between the first aerial image and the second aerial image changes during the single exposure pass.

5. The method of clause 1, wherein the single exposure pass is a first exposure pass, and the method further comprising: passing a second set of pulses of light in the light beam through the mask toward the wafer during a second exposure pass and after the first exposure pass is completed, and wherein the separation distance between the first aerial image and the second aerial image is different during the first exposure pass and the second exposure pass.

6. The method of clause 1, wherein the separation distance between the first aerial image and the second aerial image is set prior to the single exposure pass, and the separation distance does not change during the single exposure pass.

7. The method of clause 6, wherein the separation distance between the first aerial image and the second aerial image is set to accommodate one or more features of the photolithography system.

8. The method of clause 1, wherein the set of pulses comprises a first group of pulses of light and a second group of pulses of light, each pulse in the first group of pulses of light has the first primary wavelength, each pulse in the second group of pulses has the second primary wavelength, and the method further comprising:
controlling a property of the first group of pulses to thereby control an amount of light in the first aerial image; and
controlling a property of the second group of pulses to thereby control an amount of light in the second aerial image.

9. The method of clause 8, wherein the property of the first group comprises a count of pulses in the first group, and the property of the second group comprises a count of pulses in the second group.

10. The method of clause 9, wherein controlling the count of pulses in the first group comprises determining, before the single exposure pass begins, a first number of pulses to include in the first group of pulses, and controlling the count of pulses in the second group of pulses comprises determining, before the single exposure pass, a second number of pulses to include in the second group of pulses.

11. The method of clause 10, wherein determining the first number of pulses and the second number of pulses comprises one or more of: (a) receiving input from an operator and (b) accessing a pre-defined setting associated with the photolithography system.

12. The method of clause 8, wherein the property of the first group of pulses comprises an intensity of each pulse in the first group, and the property of the second group of pulses comprises an intensity of each pulse in the second group.

13. The method of clause 1, wherein the first plane on the wafer and the second plane on the wafer are planes that are substantially perpendicular to the direction of propagation.

14. The method of clause 9, wherein the first group of pulses and the second group of pulses comprise all of the pulses that pass through the mask in the single exposure pass.

15. The method of clause 1, wherein
a first feature of the three-dimensional semiconductor is formed at the first plane,
a second feature of the three-dimensional semiconductor is formed at the second plane, and the first and second features are displaced from each other by a sidewall that extends substantially parallel to the direction of propagation.

16. The method of clause 1, wherein the three-dimensional semiconductor component comprises a three-dimensional NAND flash memory component.

17. The method of clause 1, wherein the first plane corresponds to a first focal plane and the second plane corresponds to a second focal plane, and the separation distance between the first plane and the second plane is based on a difference between one or more wavelengths in a pulse of light that passes through the mask or a difference between a wavelengths among discrete pulses in the set of pulses.

18. A photolithography system comprising:
a light source;
a lithography scanner apparatus comprising:
a mask positioned to interact with a pulsed light beam from the light source, and
a wafer holder; and
a control system coupled to the light source, the control system configured to cause the light source to emit the pulsed light beam toward the lithography scanner apparatus during a single exposure pass such that, during the single exposure pass, at least a first aerial image and a second aerial image are formed on a wafer received at the wafer holder based on pulses of light in a set of pulses of light that pass through the mask along a direction of propagation, the first aerial image being at a first plane on the wafer and the second aerial image being at a second plane on the wafer, the first plane and the second plane being separated from each other by a separation distance along the direction of propagation, and a three-dimensional semiconductor component is formed based on an interaction between light in the first aerial image and a material in a first portion of the wafer and an interaction between light in the second aerial image and a material in a second portion of the wafer, wherein
at least one of the pulses in the set of pulses has a first primary wavelength,
at least one of the other pulses in the set of pulses has a second primary wavelength that is different from the first primary wavelength such that spectra of the first and second set of pulses are spectrally distinct, and
the separation distance is based on the difference between the first primary wavelength and the second primary wavelength.

19. The photolithography system of clause 18, wherein the control system comprises a computer-readable storage medium, one or more electronic processors coupled to the computer-readable storage medium, and an input/output interface, and a recipe related to the photolithography system is stored on the computer-readable storage medium.

20. The photolithography system of clause 19, wherein the recipe specifies the separation distance.

21. The photolithography system of clause 20, wherein the recipe specifies the separation distance on a per-wafer or per-lot basis.

22. The photolithography system of clause 18, wherein the light source comprises a krypton fluoride (KrF) gain medium or a argon fluoride (ArF) gain medium. Other implementations are within the scope of the claims.

What is claimed is:

1. A method of forming a three-dimensional semiconductor component using a photolithography system, the method comprising:
passing a set of pulses of light in a light beam through a mask toward a wafer during a single exposure pass, the set of pulses comprising a first group of pulses of light and a second group of pulses of light, each pulse in the first group of pulses of light having a first primary wavelength and each pulse in the second group of pulses of light having a second primary wavelength that is different from the first primary wavelength;
generating, during the single exposure pass, at least a first aerial image and a second aerial image on the wafer based on pulses of light in the set of pulses that pass through the mask, the first aerial image being at a first plane on the wafer and the second aerial image being at a second plane on the wafer, the first plane and the second plane being separated from each other;
patterning, in photoresist, the three-dimensional semiconductor component based on an interaction between light in the first aerial image and a material in a first portion of the wafer and an interaction between light in the second aerial image and a material in a second portion of the wafer; and
controlling a property of the first group of pulses to thereby control an amount of light in the first aerial image and controlling a property of the second group of pulses to thereby control an amount of light in the second aerial image, the amount of light in the second aerial image being different from that in the first aerial image.

2. The method of claim 1, wherein at least one of the pulses in the set of pulses that passes through the mask during the single exposure pass comprises more than one primary wavelength of light.

3. The method of claim 2, wherein each primary wavelength is separated by a spectral separation of 200 femtometers (fm) to 500 picometers (pm) from the nearest other primary wavelength.

4. The method of claim 1, wherein the first plane and the second plane are separated from each other by a separation distance along the direction of propagation, and the separation distance between the first aerial image and the second aerial image changes during the single exposure pass.

5. The method of claim 1, wherein the single exposure pass is a first exposure pass, and the method further comprising: passing a second set of pulses of light in the light beam through the mask toward the wafer during a second exposure pass and after the first exposure pass is completed, and wherein a separation distance between the first aerial image and the second aerial image is different during the first exposure pass and the second exposure pass.

6. The method of claim 1, wherein a separation distance between the first aerial image and the second aerial image is set prior to the single exposure pass, and the separation distance does not change during the single exposure pass.

7. The method of claim 6, wherein the separation distance between the first aerial image and the second aerial image is set to accommodate one or more features of the photolithography system.

8. The method of claim 1, wherein the property of the first group comprises a count of pulses in the first group, and the property of the second group comprises a count of pulses in the second group.

9. The method of claim 8, wherein controlling the count of pulses in the first group comprises determining, before the single exposure pass begins, a first number of pulses to include in the first group of pulses, and controlling the count of pulses in the second group of pulses comprises determining, before the single exposure pass, a second number of pulses to include in the second group of pulses.

10. The method of claim 9, wherein determining the first number of pulses and the second number of pulses comprises one or more of: (a) receiving input from an operator and (b) accessing a pre-defined setting associated with the photolithography system.

11. The method of claim 8, wherein the first group of pulses and the second group of pulses comprise all of the pulses that pass through the mask in the single exposure pass.

12. The method of claim 1, wherein the property of the first group of pulses comprises an intensity of each pulse in the first group, and the property of the second group of pulses comprises an intensity of each pulse in the second group.

13. The method of claim 1, wherein the first plane on the wafer and the second plane on the wafer are planes that are substantially perpendicular to the direction of propagation.

14. The method of claim 1, wherein
a first feature of the three-dimensional semiconductor is formed at the first plane,
a second feature of the three-dimensional semiconductor is formed at the second plane, and
the first and second features are displaced from each other by a sidewall that extends substantially parallel to the direction of propagation.

15. The method of claim 1, wherein the three-dimensional semiconductor component comprises a three-dimensional NAND flash memory component.

16. The method of claim 1, wherein the first plane corresponds to a first focal plane and the second plane corresponds to a second focal plane, and the separation distance between the first plane and the second plane is based on a difference between one or more wavelengths in a pulse of light that passes through the mask or a difference between a wavelengths among discrete pulses in the set of pulses.

17. A photolithography system comprising:
a light source;
a lithography scanner apparatus comprising:
a mask positioned to interact with a pulsed light beam from the light source, and
a wafer holder; and
a control system coupled to the light source, the control system configured to:
cause the light source to emit the pulsed light beam toward the lithography scanner apparatus during a single exposure pass such that, during the single exposure pass, at least a first aerial image and a second aerial image are formed on a wafer received at the wafer holder based on pulses of light in a set of pulses of light that pass through the mask along a direction of propagation, the set of pulses of light including a first group of pulses of light having a first primary wavelength and a second group of pulses of light having a second primary wavelength that is different from the first primary wavelength, the first aerial image being at a first plane on the wafer and the second aerial image being at a second plane on the wafer, the first plane and the second plane being separated from each other by a separation distance along the direction of propagation, and a three-dimensional semiconductor component is formed based on an interaction between light in the first aerial image and a material in a first portion of the wafer and an interaction between light in the second aerial image and a material in a second portion of the wafer, and control a property of the first group of pulses to thereby control an amount of light in the first aerial image and control a property of the second group of pulses to thereby control an amount of light in the second aerial image, the amount of light in the second aerial image being different from that in the first aerial image.

18. The photolithography system of claim 17, wherein the control system comprises a computer-readable storage medium, one or more electronic processors coupled to the computer-readable storage medium, and an input/output interface, and a recipe related to the photolithography system is stored on the computer-readable storage medium.

19. The photolithography system of claim 18, wherein the recipe specifies the separation distance.

20. The photolithography system of claim 19, wherein the recipe specifies the separation distance on a per-wafer or per-lot basis.

21. The photolithography system of claim 17, wherein the light source comprises a krypton fluoride (KrF) gain medium or a argon fluoride (ArF) gain medium.

* * * * *